United States Patent
Doi et al.

(10) Patent No.: US 7,255,906 B2
(45) Date of Patent: Aug. 14, 2007

(54) INFORMATION RECORDING MEDIUM AND METHOD FOR PRODUCING THE SAME

(75) Inventors: Yukako Doi, Takatsuki (JP); Rie Kojima, Kadoma (JP); Noboru Yamada, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 77 days.

(21) Appl. No.: 10/898,709

(22) Filed: Jul. 23, 2004

(65) Prior Publication Data
US 2005/0018593 A1 Jan. 27, 2005

(30) Foreign Application Priority Data
Jul. 25, 2003 (JP) .............................. 2003-280165

(51) Int. Cl.
*B32B 3/02* (2006.01)
(52) U.S. Cl. ................ 428/64.5; 430/270.13; 427/248.1
(58) Field of Classification Search ............... 428/64.5; 430/270.13; 427/248.1
See application file for complete search history.

(56) References Cited

U.S. PATENT DOCUMENTS

| | | | |
|---|---|---|---|
| 6,528,442 B1* | 3/2003 | Kuwano et al. ............... 501/41 |
| 6,670,016 B1* | 12/2003 | Kim et al. ................. 428/64.4 |
| 6,689,445 B2 | 2/2004 | Kojima et al. |
| 6,854,126 B2* | 2/2005 | Hirotsune et al. .......... 720/719 |
| 6,921,568 B2* | 7/2005 | Inoue et al. ................ 428/64.1 |
| 2001/0041304 A1 | 11/2001 | Uno et al. |
| 2003/0190447 A1* | 10/2003 | Kojima et al. ............. 428/64.1 |
| 2004/0222479 A1* | 11/2004 | Uno et al. ................... 257/432 |
| 2005/0019695 A1* | 1/2005 | Kojima et al. ......... 430/270.13 |
| 2005/0202204 A1* | 9/2005 | Nishihara et al. .......... 428/64.4 |

FOREIGN PATENT DOCUMENTS

EP 0 825 595 2/1998

(Continued)

OTHER PUBLICATIONS

Yamada et al. "Phase-change optical disk having a nitride interface layer". *Japanese Journal of Applied Physics*, vol. 37, Part 1, No. 4B, pp. 2104-2110, Apr. 1998.

(Continued)

*Primary Examiner*—Bruce H. Hess
(74) *Attorney, Agent, or Firm*—Hamre, Schumann, Mueller & Larson, P.C.

(57) ABSTRACT

In an information recording medium of the present invention, a recording layer and first and second dielectric layers are formed on a surface of a substrate. In the recording layer, at least one of recording and reproduction is caused by irradiation of light or application of electric energy. The dielectric layers are oxide-based material layers or oxide-nitride-based material layers containing an oxide of at least one element selected from the group GM consisting of Sn, Ga and Zn, and at least one of an oxide and a nitride of at least one element selected from the group GL consisting of Al, Si and B, or oxide-fluoride-based material layers containing a fluoride of at least one element selected from La and Ce, and one example of at least one of element selected from the group GM.

51 Claims, 5 Drawing Sheets

FOREIGN PATENT DOCUMENTS

| | | |
|---|---|---|
| JP | 6-15960 | 1/1994 |
| JP | 7-25209 | 3/1995 |
| JP | 10-275360 | 10/1998 |
| JP | 2001-322357 | 11/2001 |
| JP | 2003-228881 | 8/2003 |
| WO | WO97/34298 | 9/1997 |

OTHER PUBLICATIONS

Kubota. *Wave Optics*, Chapter 3. Iwatani Shoten, Publishers, pp. 206-214, Feb. 1971, and partial English translation.

* cited by examiner

INFORMATION RECORDING MEDIUM AND METHOD FOR PRODUCING THE SAME

BACKGROUND OF THE INVENTION

1. Field of the Invention

The present invention relates to an information recording medium that allows at least one of recording and reproduction of information by optical or electrical means and a method for producing the same.

2. Description of the Related Art

As a conventional information recording medium, the inventors of the present invention have developed and commercialized 4.7 GB/DVD-RAM (Digital Versatile Disk-Random Access Memory), which is a large capacity rewritable phase change information recording medium that can be used as a data file and an image file (e.g., JP2001-322357). FIG. 6 shows the structure of this information recording medium (DVD-RAM). The information recording medium shown in FIG. 6 has a multilayered film having a seven layer structure in which a first dielectric layer 102, a first interface layer 103, a recording layer 4, a second interface layer 105, a second dielectric layer 106, a light-absorption correction layer 7 and a reflective layer 8 are formed on one surface of a substrate 1 in this order. In this information recording medium, the first dielectric layer 102 is provided in a position nearer to the laser light incident side than the second dielectric layer 106. The first interface layer 103 and the second interface layer 105 have the same positional relationship. Thus, in this specification, when an information recording medium includes at least two layers having the same function, the layers are referred to as "the first", "the second", "the third" . . . sequentially, starting from the layer that is at the nearest side when viewed from the incident laser light.

The first dielectric layer 102 and the second dielectric layer 106 serve to adjust the optical distance to increase the optical absorption efficiency of the recording layer 4 and increase the difference in the reflectance between when the recording layer 4 is in a crystalline phase and when the recording layer 4 is in an amorphous phase so as to increase the signal amplitude. A mixture of 80 mol % of ZnS and 20 mol % of $SiO_2$ (hereinafter, expressed by "$(ZnS)_{80}(SiO_2)_{20}$ (mol %)" in this specification; other mixtures also are expressed in the same manner) that conventionally has been used as a material for a dielectric layer is amorphous, has a low thermal conductivity, is transparent and has a high refractive index. $(ZnS)_{80}(SiO_2)_{20}$ (mol %) also has a high film-formation speed when a film is being formed, and good mechanical characteristics and moisture resistance. Thus, $(ZnS)_{80}(SiO_2)_{20}$ (mol %) is an excellent material as a dielectric layer of an information recording medium.

When the thermal conductivities of the first dielectric layer 102 and the second dielectric layer 106 are low, the heat generated when laser light is incident on the recording layer 4 is hardly diffused in the in-plane direction of the dielectric layers 102 and 106. In particular, when the thermal conductivity of the second dielectric layer 106 is low, the heat is diffused in the thickness direction from the recording layer 4 to the reflective layer 8 rapidly, so that the recording layer 4 is cooled in a shorter time, which makes it easy to form an amorphous mark (recording mark). When the recording mark is hard to form, it is necessary to record information with a high peak power, whereas when the recording mark is formed easily, information can be recorded with a low peak power. Thus, when the thermal conductivities of the first dielectric layer 102 and the second dielectric layer 106 are low, information can be recorded with a low peak power, and thus the recording sensitivity of the information recording medium can be increased.

When the thermal conductivities of the first dielectric layer 102 and the second dielectric layer 106 are high, information is recorded with a high peak power, and thus the recording sensitivity of the information recording medium becomes low. The dielectric layers 102 and 106 are present in the form of a thin film having such a small thickness that its thermal conductivity cannot be measured accurately. Therefore, the inventors of the present invention use the recording sensitivity of the information recording medium as a relative determination basis that provides the magnitude of the thermal conductivity of the dielectric layers.

The recording layer 4 is formed of, for example, a material that is crystallized in a high speed including Ge—Sn—Sb—Te. An information recording medium having such a material as the recording layer 4 has not only excellent initial recording performance, but also excellent archival characteristic and archival overwrite characteristic. Information is recorded, erased and rewritten in a rewritable phase change information recording medium by utilizing the fact that a reversible phase change is caused between a crystalline phase and an amorphous phase in the recording layer 4. When the recording layer 4 is irradiated with laser light with a high power (peak power) and cooled, the irradiated portion is converted to an amorphous phase and a recording mark is formed. When the recording layer 4 is irradiated with laser light with a low power (bias power) to be heated and then cooled gradually, the irradiated portion is converted to a crystalline phase and the recorded information is erased. The already recorded information can be erased and rewritten to new information by irradiating the recording layer with laser light whose power is modulated between the peak power level and the bias power level. The repeated rewriting performance is indicated by the maximum number of times of repetitions of rewriting within a range that causes no problem of jitter values in practical use. When this value is larger, the repeated rewriting performance is better. In particular, it is desirable for information recording media for data files to have good repeated rewriting performance.

The first interface layer 103 and the second interface layer 105 serve to prevent substance movement that might be caused between the first dielectric layer 102 and the recording layer 4 and between the second dielectric layer 106 and the recording layer 4 (see JP10-275360A and International Publication No. 97/34298 regarding layers that serve to prevent substance movement). The first and the second interface layers 103 and 105 prevent S atoms of $(ZnS)_{80}(SiO_2)_{20}$ (mol %) contained in the first and the second dielectric layers 102 and 106 from being diffused to the recording layer 4 while information is being rewritten by irradiating the recording layer 4 with laser light. It is known that when a large amount of S atoms are diffused to the recording layer 4, the reflectance of the recording layer 4 is reduced, and the repeated rewriting performance deteriorates (e.g., see N. Yamada et al., Japanese Journal of Applied Physics Vol. 37(1998) pp. 2104–2110).

The light-absorption correction layer 7 serves to adjust the ratio Ac/Aa of the light absorptance Ac when the recording layer 4 is in a crystalline state and the light absorptance Aa when the recording layer 4 is in an amorphous state, and prevent the mark shape from being distorted at the time of rewriting. The reflective layer 8 serves to facilitate change of the recording layer 4 into amorphous, optically by increasing the light amount that is absorbed by the recording layer 4 and thermally by diffusing heat generated in the recording layer 4, rapidly to cool the recording layer 4 rapidly. Furthermore, the reflective layer 8 also serves to protect the multilayered film from the use environment.

Thus, the information recording medium shown in FIG. 6 has a structure in which the seven layers functioning in the above-described manner are laminated so that excellent repeated rewriting performance and high reliability can be ensured at a large capacity of 4.7 GB, and thus has been commercialized.

As described above, when $(ZnS)_{80}(SiO_2)_{20}$ (mol %) is used for the first and the second dielectric layers and the first and the second dielectric layers are formed so as to be in contact with the recording layer 4, S atoms of $(ZnS)_{80}(SiO_2)_{20}$ (mol %) contained in the first and the second dielectric layers are diffused to the recording layer with laser light while information is being rewritten by irradiating the recording layer. Thus, the reflectance of the recording layer is reduced, and the repeated rewriting performance deteriorates. Therefore, it is necessary to provide an interface layer for suppressing substance movement between the recording layer and the dielectric layers in order to ensure the repeated rewriting characteristics as in the information recording medium shown in FIG. 6. However, in view of the price of media, the smaller the number of the layers constituting a medium is, the more desirable it is. This is because a reduction in the number of layers can achieve a reduction in the material cost, compactness of production apparatuses, and an increase in production volume by reducing the production time, which consequently leads to a reduction in the price of the medium.

The inventors of the present invention examined the possibility of eliminating at least one interface layer of the first interface layer and the second interface layer as a method for reducing the number of layers. The interface layer is a very thin layer having a thickness of, for example, 2 nm to 5 nm, and is structurally very fragile. Therefore, film rupture is caused while information is being recorded repeatedly, and consequently atomic diffusion tends to occur. Therefore, it also is desirable to eliminate the interface layers in terms of the stability of the information recording medium. In order to reduce the number of the interface layers to a smaller number, it is necessary to form the dielectric layers with a material that does not allow movement of S, that is, a material system that is free from S atoms.

Regarding the material of the dielectric layers, the following is desirable: (1) having some transparency with respect to light of a wavelength for recording and reproduction in order to ensure sufficient absorption of light to the recording layer for efficient recording and sufficient reflected light for reproducing recorded information satisfactorily; (2) providing recording sensitivity equal to or more than that of an information recording medium containing a multilayered film having a seven layer structure in which an interface layer is provided; (3) being thermally stable and having a high melting point so as not to be melted by repeated rewriting; (4) having a high film-formation speed at the time of forming a film in order to ensure productivity; and (5) having excellent reliability.

The present invention is directed to providing an information recording medium having good repeated rewriting performance by providing a material layer in which substance movement to the recording layer is suppressed and that has good adhesion with the recording layer, even if it is formed in contact with the recording layer without providing an interface layer.

SUMMARY OF THE INVENTION

A first information recording medium of the present invention includes a substrate and a recording layer that allows at least one of recording and reproduction by irradiation of light or application of electric energy, and further includes a material layer containing at least one element selected from the group GM consisting of Sn, Ga and Zn, at least one element selected from the group GL consisting of Al, Si and B, and oxygen (O), and optionally nitrogen (N).

A second information recording medium of the present invention includes a substrate and a recording layer that allows at least one of recording and reproduction by irradiation of light or application of electric energy, and further includes a material layer containing at least one element selected from the group GM consisting of Sn, Ga and Zn, oxygen (O), at least one element selected from the group GA consisting of La and Ce, and fluorine (F).

A first method for producing an information recording medium of the present invention is a method for producing an information recording medium including a substrate, a recording layer and a material layer that allows at least one of recording and reproduction by irradiation of light or application of electric energy, and includes forming the material layer by sputtering, using a sputtering target containing at least one element selected from the group GM consisting of Sn, Ga and Zn, at least one element selected from the group GL consisting of Al, Si and B, and oxygen (O), and optionally nitrogen (N).

A second method for producing an information recording medium of the present invention is a method for producing an information recording medium including a substrate, a recording layer and a material layer that allows at least one of recording and reproduction by irradiation of light or application of electric energy, and includes forming the material layer by sputtering, using a sputtering target containing at least one element selected from the group GM consisting of Sn, Ga and Zn, oxygen (O), at least one element selected from the group GA consisting of La and Ce, and fluorine (F).

DESCRIPTION OF THE PREFERRED EMBODIMENTS

Figure 1:
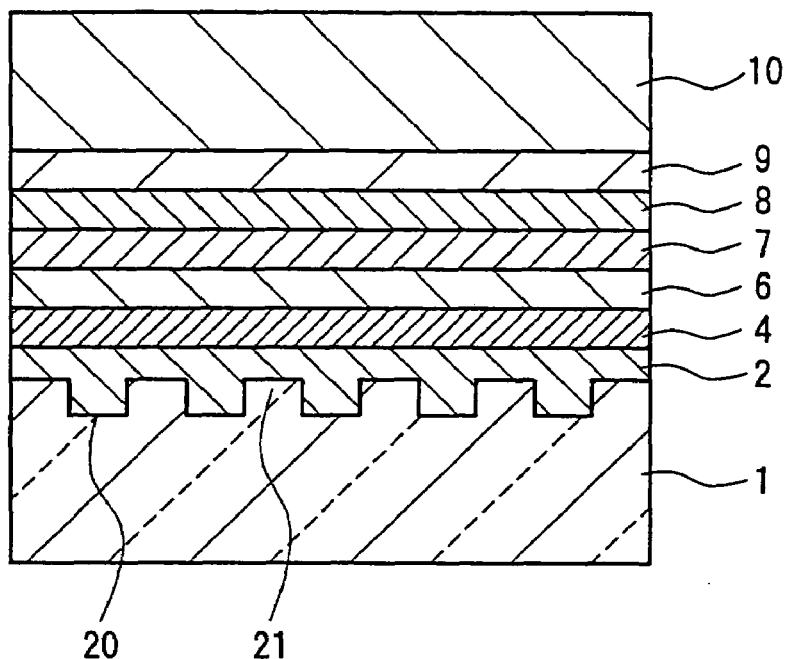
FIG. 1 is a partial cross-sectional view showing an example of an information recording medium of Embodiment 1 of the present invention.

A first information recording medium of the present invention contains a material layer containing at least one element selected from the group GM consisting of Sn, Ga and Zn, at least one element selected from the group GL consisting of Al, Si and B, and oxygen (O). The material layer further may contain nitrogen (N). When the material layer is formed of such a material, the following advantages can be provided: the film-formation speed equal to or more than that of the conventional information recording medium in which the dielectric layer is formed of $(ZnS)_{80}(SiO_2)_{20}$ (mol %) can be realized; there is no need to provide a separate interface layer when a material layer is applied as a dielectric layer since the elements constituting the material layer does not include S; and a dielectric layer having some transparency with respect to a wavelength for recording and reproduction can be formed. Furthermore, when such a material layer is used, sufficient recording sensitivity and rewriting performance can be obtained even if dielectric layers are provided directly on and beneath the recording layer without an interface layer. The first information recording medium of the present invention is a medium on/from which information can be recorded/reproduced by irradiation of light or application of electric energy. In general, irradiation of light is performed by irradiating laser light, and application of electric energy is performed by applying a voltage to the recording layer. Hereinafter, the material of the material layer constituting the first information recording medium of the present invention will be described more specifically.

In the first information recording medium of the present invention, the material layer may contain a material expressed by the following composition formula:

$$M_H O_I L_J N_K \text{ (atom \%)} \qquad (1)$$

where M is at least one element selected from the group GM, L is at least one element selected from the group GL, and H, I, J and K satisfy $10 \leq H \leq 50$, $10 \leq I \leq 70$, $0 < J \leq 40$, and $0 \leq K \leq 50$. Herein, "atom %" indicates that composition formula (1) is a composition formula expressed by taking the total number of M atoms, oxygen atoms, L atoms and nitrogen atoms as the reference (100%). In composition formulae below, the indication of "atom %" is used in the same sense. In composition formula (1), only M atoms, oxygen atoms, L atoms and nitrogen atoms contained in the material layer are counted and shown. Therefore, the material layer containing the material expressed by composition formula (1) may contain components other than these atoms. Furthermore, in the material expressed by the composition formula (1), each atom can be present as any compound. The material is specified by such a composition formula for the following reason: when investigating the composition of a layer made into a thin film, it is difficult to obtain the composition of the compound, and therefore in reality, it is common to obtain only the element composition (i.e., ratio of the atoms). In the material expressed by composition formula (1), it is believed that most of M is present in the form of an oxide in combination with oxygen atoms, and most of L is present in the form of oxide or nitrogen in combination with oxygen atoms or nitrogen atoms.

In the first information recording medium of the present invention, it is preferable that the element M contained in the material layer is at least one of Sn and Ga. The material layer containing Sn is preferable in terms of productivity, because it has a particularly high film-forming speed among the material layers containing an element constituting the group GM. The material layer containing Ga is more preferable, because the rewiring characteristics are particularly good among the material layers containing an element constituting the group GM.

When the first information recording medium of the present invention is an optical information recording medium, it is preferable to form one or both of the two dielectric layers adjacent to the recording layer, using a material layer (hereinafter, referred to as "an oxide-based material layer" or "oxide-nitride-based material layer") containing an element selected from the group GM, an element selected from the group GL, and oxygen (O) or oxygen (O) and nitrogen (N). For example, in the case of a recording medium for recording by phase change, the melting point of the main material system constituting the recording medium is about 500 to 700° C., whereas all of the oxides of the elements constituting the group GM, that is, Sn, Ga and Zn, have a melting point of 1000° C. or more, and thus the thermal stability is excellent. A dielectric layer containing a material having good thermal stability hardly deteriorates even if information is rewritten repeatedly on an information recording medium containing this dielectric layer, and thus has good durability. The nitrides and the oxides of the elements constituting the group GL, that is, Al, Si and B have good moisture resistance. Moreover, all of the above-described oxides and nitrides have good adhesion with a recording layer formed of a chalcogenide material. Therefore, with the information recording medium in which the dielectric layer is formed of such an oxide-based material layer or an oxide-nitride-based material layer, the following advantages can be provided.

Figure 6:
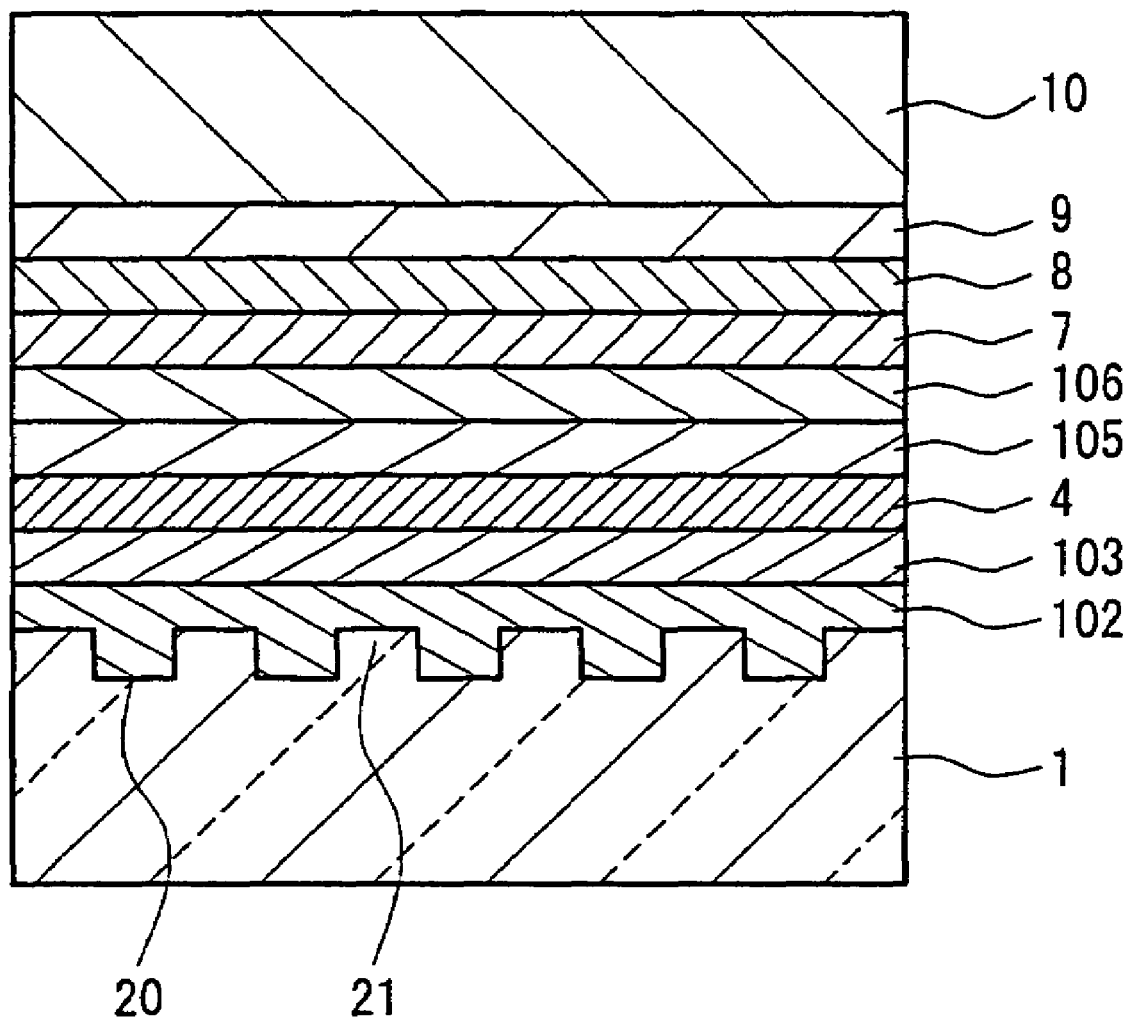
FIG. 6 is a partial cross-sectional view showing an example of a conventional information recording medium.

(1) No interface layer is required because the dielectric layer that is free from S can be attached satisfactorily with the recording layer;

(2) The durability and the moisture resistance against repeated rewriting that is equal to or more than those of the conventional information recording medium shown in FIG. 6 can be provided for the information recording medium; and (3) The recording sensitivity is increased because the structure becomes complicated by mixing a plurality of oxides and nitrides, so that the thermal conductivity of the dielectric layer is reduced, and thus the recording layer tends to be cooled rapidly.

In the first information recording medium of the present invention, the material layer may contain a material that is expressed by the composition formula (1) and contains a material containing Sn as M. Sn is an element that can provide a higher film-forming speed and a higher productivity among the elements constituting the group GM. Therefore, an information recording medium having better repeated rewriting performance and good productivity can be produced inexpensively by using a material layer containing Sn for one or both of the two dielectric layers adjacent to the recording layer of the information recording medium.

In the first information recording medium of the present invention, the material layer may contain a material that is expressed by the composition formula (1) and contains a material containing Ga as M. Ga has an excellent effect of providing particularly good rewriting characteristics among the elements constituting the group GM. Therefore, a highly reliable information recording medium having better repeated rewriting characteristics can be achieved by using a material layer containing Ga for one or both of the two dielectric layers adjacent to the recording layer of the information recording medium.

In the first information recording medium of the present invention, the material layer may contain a material that is expressed by the composition formula (1) and contains a material containing Sn as M and at least one of Si and Al as L. Sn has been described above, and Si has an excellent effect of improving particularly recording sensitivity among the elements constituting the group GL. Moreover, the film quality of the material layer is softened by including an oxide of Si, so that film cracking and film rupture of the material layer due to repeated rewriting can be suppressed. Therefore, an information recording medium having better recording sensitivity, and being useful for further high density and high speed recording techniques can be achieved by using a material layer containing Sn and at least one of Si and Al for one or both of the two dielectric layers adjacent to the recording layer of the information recording medium.

In the first information recording medium of the present invention, the material layer may contain a material that is expressed by the composition formula (1) and contains a material containing Ga as M and at least one of Si and Al as L. Ga, Si and Al have been described above. Therefore, a highly reliable information recording medium having better repeated rewriting characteristics and good recording sensitivity can be achieved by using a material layer containing such a material for one or both of the two dielectric layers adjacent to the recording layer of the information recording medium.

In the first information recording medium of the present invention, the material layer may contain a material that is expressed by the composition formula (1) and contains a material containing Sn and Ga as M and at least one of Si and Al as L. Thus, a highly reliable information recording medium having good recording sensitivity, excellent repeated rewriting performance and high productivity can be produced inexpensively by using a material layer containing such a material for one or both of the two dielectric layers adjacent to the recording layer of the information recording medium.

A second information recording medium of the present invention contains a material layer containing at least one element selected from the group GM consisting of Sn, Ga and Zn, oxygen (O), at least one element selected from the group GA consisting of La and Ce, and fluorine (F). The material layer contained in the second information recording medium can contain a material expressed by the following composition formula:

$$M_H O_I A_D F_E \text{ (atom \%)} \quad (2)$$

where M is at least one element selected from the group GM, A is at least one element selected from the group GA, and H, I, D and E satisfy $10 \leq H \leq 50$, $10 \leq I \leq 70$, $0 < D \leq 40$, and $0 < E \leq 50$. La and Ce can be used preferably because good recording sensitivity can be obtained by being mixed with the oxide of the group GM, and the prices are lower among fluorides of rare earth metals. The material layer contained in the second information recording medium is referred to as an "oxide-fluoride-based material layer".

In the second information recording medium of the present invention, it is preferable that the element M contained in the material layer is at least one of Sn and Ga. The material layer containing Sn is preferable in terms of productivity, because it has a particularly high film-forming speed among the material layers containing the elements constituting the group GM. The material layer containing Ga is more preferable, because the rewiring characteristics are particularly good among the material layers containing the elements constituting the group GM.

As described above, it seems that in the oxide-based material layer and the oxide-nitride-based material layer and the oxide-fluoride-based material layer, at least one element selected from the group GM consisting of Sn, Ga and Zn is present in the form of oxide with oxygen, at least one element selected from the group GL consisting of Al, Si and B is present in the form of oxide or nitride with oxygen or nitrogen, and at least one element selected from the group GA consisting of La and Ce is present in the form of fluoride, and these layers can be specified as layers containing these compounds. In the thus specified material layers, it is preferable that the oxide group of at least one element selected from the group GM is contained in an amount of 50 mol % or more, more preferably 50 mol % to 95 mol %, on the basis of the combined amount (100 mol %) of the oxide group of an element selected from the group GM and the oxide group or the nitride group of an element selected from the group GL. The same is true when the amount obtained by also combining the fluoride group of an element selected from the group GA is used as the basis.

Herein, the "oxide group" is used to refer collectively to all oxides when two or more elements are selected from the group GM and two or more kinds of oxides are contained. Alternatively, when only one element is selected from the group GM and one oxide is contained in the layer, then the "oxide group" refers to only this oxide. The same is true for the terms "nitride group" and "fluoride group". In other words, the oxide-based material layer, the oxide-nitride-based material layer, and the oxide-fluoride-based material layer may contain compounds other than the above-specified compounds (such compounds are referred to as "third component") in an amount up to 10 mol %. This is because when the ratio of the third component exceeds 10 mol %, the thermal stability of the material layer is reduced, and the deterioration of the recording sensitivity and the rewriting characteristics and the reduction of the moisture resistance tend to occur, and it becomes difficult to obtain certain advantages as described above.

The dielectric layer formed of the above-specified material layer may contain several mol % or less of impurities or some amount of elements of the compositions of materials constituting neighboring layers.

When the ratio of the oxide group of an element selected from the group GM is less than 50 mol %, the film-forming speed and the moisture resistance tend to be reduced. This is because the internal stress in the film of the material layer is too large, and local peeling with another layer tends to occur, depending on the thickness of the formed film.

Oxides of Sn or oxides of Ga may be contained as the oxide group of at least one element selected from the group GM, and nitrides of Si or oxides of Si may be contained as the oxide group or the nitride group of at least one element selected from the group GL, and the effects are as described above.

Furthermore, in the first information recording medium of the present invention, the material layer contains an oxide of at least one element selected from the group GM, preferably at least one oxide selected from $SnO_2$, $Ga_2O_3$ and ZnO, and at least one compound selected from AlN, $Si_3N_4$, $Al_2O_3$ and $SiO_2$ as at least one of an oxide and a nitride of at least one element selected from group GL, more specifically may contain a material expressed by the following composition formula:

$$(D)_X(E)_{100-X} \text{ (mol \%)} \quad (3)$$

where D is at least one oxide selected from $SnO_2$, $Ga_2O_3$ and ZnO, E is at least one compound selected from AlN, $Si_3N_4$, $Al_2O_3$ and $SiO_2$, and X satisfies $50 \leq X \leq 95$. All of $SnO_2$, $Ga_2O_3$ and ZnO have high melting points of 1000° C. or more, and are thermally stable and have high film forming speeds. AlN, $Si_3N_4$, $Al_2O_3$ and $SiO_2$ have good moisture resistance, and have a high effect of reducing the thermal conductivity especially when mixed with the oxide group ($SnO_2$, $Ga_2O_3$ and ZnO) as described above, and consequently have an excellent function of improving the recording sensitivity. Moreover, since the price is low, they are the most suitable for practical use. The preferable ratio of the compounds is defined by X, as described above. It is possible to eliminate an interface layer between the dielectric layer and the recording layer by applying such an oxide-nitride-based material layer for the dielectric layers in contact with the recording layer. Therefore, the information recording medium containing such a material layer as the dielectric layer has good repeated recording performance, moisture resistance, recording sensitivity, and recording, and archival characteristic and archival overwrite characteristic.

In the first information recording medium of the present invention, it is more preferable that the material layer contains a material expressed by the following composition formula:

$$(SnO_2)_{A1}(Ga_2O_3)_{A2}(E1)_B \text{ (mol \%)} \qquad (4)$$

where E1 is at least one nitride selected from AlN and $Si_3N_4$, and A1 and A2 satisfy $50 \leq A1+A2 \leq 95$, and either one of A1 and A2 may be 0, and B satisfies $5 \leq B \leq 50$; and $A1+A2+B=100$. The preferable ratio thereof can be defined by A1 and A2 as described above.

In the first information recording medium of the present invention, the material layer contains an oxide of at least one element selected from the group GM and further may contain a material expressed by the following composition formula containing $SiO_2$:

$$(D)_X(SiO_2)_Y(E1)_{100-x-y} \text{ (mol \%)} \qquad (5)$$

where D is at lease one oxide selected from $SnO_2$, $Ga_2O_3$, and ZnO, E1 is at least one nitride of AlN and $Si_3N_4$, and X and Y satisfy $50 \leq X \leq 95$, $5 \leq Y \leq 35$, and $55 \leq X+Y \leq 100$. The preferable ratio thereof can be defined by X and Y as described above. Herein, $X+Y \leq 100$ is shown. This is because the cases where nitride E1 is not contained are included. The effects of $SiO_2$ are as described above.

In the second information recording medium of the present invention, it is preferable that the material layer contains a material expressed by the following composition formula:

$$(D)_X(A)_{100-X} \text{ (mol \%)} \qquad (6)$$

where D is at least one oxide selected from $SnO_2$, $Ga_2O_3$, and ZnO, A is at least one compound selected from $LaF_3$ and $CeF_3$, and X satisfies $50 \leq X \leq 95$. The ratio thereof is defined by X as described above. Regarding the oxides of at least one element selected from the group GM, the same as in the case of the oxides or the oxide-nitride layers as described above applies.

The composition analysis of the oxide-based material layer, the oxide-nitride-based material layer or the oxide-fluoride-based material layer contained in the first and the second information recording media of the present invention can be performed, for example, with a X ray microanalyzer. The analyzed composition can be obtained as the atom concentration of each element.

In the first and the second information recording media of the present invention, it is preferable to provide the oxide-based material layer, the oxide-nitride-based material layer or the oxide-fluoride-based material layer so as to be in contact with at least one face of the recording layer, and these layers may be provided so as to be in contact with both faces of the recording layer. In the information recording medium of the present invention, the oxide-based material layer, the oxide-nitride-based material layer or the oxide-fluoride-based material layer may be present as an interface layer positioned between the recording layer and the dielectric layer.

In the first and the second information recording media of the present invention, it is preferable that in the recording layer, a phase change is caused reversibly, that is, the media of the present invention preferably are provided preferably as a rewritable information recording medium. It is preferable that the recording layer in which a phase change is caused reversibly contains any one material selected from Ge—Sb—Te, Ge—Sn—Sb—Te, Ge—Bi—Te, Ge—Sn—Bi—Te, Ge—Sb—Bi—Te, Ge—Sn—Sb—Bi—Te, Ag—In—Sb—Te and Sb—Te. All of these are high speed crystallization materials. Therefore, when the recording layer is formed of these materials, recording can be performed at high density and high transfer rate, so that an information recording medium having excellent reliability (more specifically, archival characteristic or archival overwrite characteristic) can be obtained.

In the first and the second information recording media of the present invention, it is preferable that the thickness of the recording layer is 15 nm or less in order to cause a reversible phase change in the recording layer. When the thickness exceeds 15 nm, heat applied to the recording layer is diffused in the inplane, and hardly diffused in the thickness direction, so that a problem may arise in rewriting information.

More specifically, the first and the second information recording media may have a structure in which a first dielectric layer, a recording layer, a second dielectric layer and a reflective layer are formed on one surface of a substrate in this order. An information recording medium having this structure is a medium in which information is recorded by irradiation of light. In this specification, the "first dielectric layer" refers to a dielectric layer that is in the nearer position to the incident light, and the "second dielectric layer" refers to a dielectric layer that is in the farther position from the incident light. That is to say, the irradiated light reaches the second dielectric layer from the first dielectric layer through the recording layer. The information recording medium having this structure is used when information is recorded/reproduced with laser light of a wavelength in the vicinity of, for example, 660 nm. When the first and the second information recording media have this structure, at least one dielectric layer of the first dielectric layer and the second dielectric layer is an oxide-based material layer, an oxide-nitride-based material layer or an oxide-fluoride-based material layer as described above. Alternatively, both the dielectric layers may be formed of either one of the above-described material layers or may be formed of material layers having the same composition or different compositions.

One form of the information recording medium having this structure is as follows: a first dielectric layer, an interface layer, a recording layer, a second dielectric layer, a light-absorption correction layer and a reflective layer are formed on one surface of a substrate in this order, and the second dielectric layer is formed of the oxide-based material layer, the oxide-nitride-based material layer or the oxide-fluoride-based material layer, and is in contact with the recording layer.

Next, first and second methods for producing an information recording medium of the present invention will be described.

A first method for producing an information recording medium of the present invention includes the step of forming a material layer contained in the first information recording medium of the present invention by sputtering. By sputtering, a material layer having substantially the same composition as that of a sputtering target can be formed. Therefore, according to this production method, an oxide-based material layer, an oxide-nitride-based material layer or an oxide-fluoride-based material layer having a desired composition can be formed easily by selecting a suitable sputtering target. More specifically, a sputtering target containing a material expressed by the following composition formula can be used:

$$M_h O_i L_j N_k \text{ (atom \%)} \qquad (7)$$

where M is at least one element selected from the group GM, L is at least one element selected from the group GL, and h, i, j and k satisfy $10 \leq h \leq 50$, $10 \leq i \leq 70$, $0 < j \leq 40$, and $0 \leq k \leq 50$. The composition formula (7) corresponds to a formula in which a material in which most of the element M selected from the group GM may be present in the form of oxide, most of the element L selected from the group GL may be present in the form of nitride, and Si may be present in the form of oxide is expressed with the element composition. With this sputtering target, a dielectric layer containing a material expressed by the composition formula (1) can be formed.

As the sputtering target containing a material expressed by the composition formula (7), a sputtering target containing Sn as M can be used. With this sputtering target, a material layer containing Sn as M in the material expressed by the composition formula (1) can be formed.

As the sputtering target containing a material expressed by the composition formula (7), a sputtering target containing Ga as M can be used. With this sputtering target, a material layer containing Ga as M in the composition formula (1) can be formed.

As the sputtering target containing a material expressed by the composition formula (7), a sputtering target containing Sn as M and at least one element of Si and Al as L can be used. With this sputtering target, a material layer containing Sn as M and at least one of Si and Al as L in the composition formula (1) can be formed.

As the sputtering target containing a material expressed by the composition formula (7), a sputtering target containing Ga as M and at least one of Si and Al as L can be used. With this sputtering target, a material layer containing Ga as M and at least one element of Si and Al as L in the composition formula (1) can be formed.

As the sputtering target containing a material expressed by the composition formula (7), a sputtering target containing Sn and Ga as M and at least one element of Si and Al as L can be used. With this sputtering target, a material layer containing Sn and Ga as M and at least one element of Si and Al as L in the composition formula (1) can be formed.

As the sputtering target used in a second method for producing an information recording medium, a sputtering target containing a material expressed by the following composition formula can be used:

$$M_h O_i A_d F_e \text{ (atom \%)} \qquad (8)$$

where M is at least one element selected from the group GM, A is at least one element selected from the group GA, and h, i, d and e satisfy $10 \leq h \leq 50$, $10 \leq i \leq 70$, $0 < d \leq 40$, and $0 < e \leq 50$. With this sputtering target, a material layer expressed by the composition formula (2) can be formed.

As the sputtering target used in the first method for producing an information recording medium, a sputtering target containing an oxide of at least one element selected from the group GM consisting of Sn, Ga and Zn, and at least one of an oxide and a nitride of at least one element selected from the group GL consisting of Al, Si and B can be used. As the sputtering target used in the second method for producing an information recording medium, a sputtering target containing an oxide of at least one element selected from the group GM consisting of Sn, Ga and Zn, and at least one of a fluoride of at least one element selected from the group GA consisting of La and Ce can be used. The sputtering target is specified as above, because in general, the sputtering target containing en element selected from the group GM, oxygen, an element selected from the group GL, an element selected from the group GA, nitrogen, and fluorine is supplied with an indication of the composition of an oxide of en element selected from the group GM, an oxide or a nitride of an element selected from the group GL, or a fluoride of an element selected from the group GA. The inventors of the present invention have confirmed that the element composition obtained by analyzing the sputtering target having the thus expressed composition with a X-ray microanalyzer is substantially equal to the element composition calculated from the expressed composition (i.e., the composition indication (nominal composition) is proper). Therefore, the sputtering target supplied in the form of a mixture of oxides, an oxide and a nitride, an oxide and a fluoride preferably can be used in the method for producing an information recording medium.

It is preferable that the sputtering target provided as a mixture of oxides or an oxide and a nitride contains the oxide group of an element selected from the group GM in an amount of 50 mol % or more, more preferably 50 mol % to 95 mol %, on the basis of the combined amount (100 mol %) of the oxide group of an element selected from the group GM and the oxide group or the nitride group of an element selected from the group GL. When the ratio of the oxide group of an element selected from the group GM is less than 50 mol %, the ratio of the oxide group of an element selected from the group GM in the obtained oxide-based material layer or oxide-nitride-based material layer is less than 50 mol %, so that an information recording medium that can provide desired effects may not be obtained. This is true for the sputtering targets provided as a mixture of an oxide and a fluoride.

It is more preferable that the sputtering target provided as a mixture of oxides, an oxide and a nitride or an oxide and a fluoride contains an oxide of Sn and an oxide of Ga in a combined content of 50 mol % or more as the oxide of elements selected from the group GM, because the productivity is high. If the sputtering target provided as a mixture of oxides or an oxide and a nitride contains a nitride of Si as the nitride of an element selected from the group GL or an oxide of Si as the oxide thereof, an information recording medium having more preferable characteristics can be produced.

More specifically, a sputtering target that preferably can be used contains at least one oxide selected from $SnO_2$, $Ga_2O_3$ and ZnO as an oxide of an element selected from the group GM, and at least one compound selected from AlN, $Si_3N_4$, $Al_2O_3$ and $SiO_2$ as at least one of an oxide and a nitride of at least one element selected from group GL. It is preferable that such a sputtering target contains a material expressed by the following composition formula:

$$(D)_x (E)_{100-x} \text{ (mol \%)} \qquad (9)$$

where D is at least one oxide selected from $SnO_2$, $Ga_2O_3$ and ZnO, E is at least one compound selected from AlN, $Si_3N_4$, $Al_2O_3$ and $SiO_2$, and x satisfies $50 \leq x \leq 95$. With this sputtering target, a material layer containing a material expressed by the composition formula (3) can be formed.

The sputtering target containing a material expressed by the composition formula (9) may contain $SnO_2$ and $Ga_2O_3$ as D. It is preferable that such a sputtering target contains a material expressed by the following composition formula:

$$(SnO_2)_{a1}(Ga_2O_3)_{a2}(E1)_b \text{ (mol \%)} \quad (10)$$

where E1 is at least one nitride selected from AlN and $Si_3N_4$, a1 and a2 satisfy $50 \leq a1+a2 \leq 95$, either one of a1 and a2 may be 0, b satisfies $5 \leq b \leq 50$, and $a1+a2+b=100$. With this sputtering target, a material layer containing a material expressed by the composition formula (4) can be formed.

The sputtering target containing a material expressed by the composition formula (9) may contain a material expressed by the following composition formula containing $SiO_2$:

$$(D)_x(SiO_2)_y(E1)_{100-x-y} \text{ (mol \%)} \quad (11)$$

where D is at least one oxide selected from $SnO_2$, $Ga_2O_3$, and ZnO, E1 is at least one nitride selected from AlN and $Si_3N_4$, x and y satisfies $50 \leq x \leq 95$, $5 \leq y \leq 35$, and $55 \leq x+y \leq 100$. With this sputtering target, a material layer containing a material expressed by the composition formula (5) can be formed.

A sputtering target containing an oxide of an element selected group GM and a fluoride of an element selected group GA can be used. It is preferable that such a sputtering target contains a material expressed by the following composition formula:

$$(D)_x(A)_{100-x} \text{ (mol \%)} \quad (12)$$

where D is at least one oxide selected from $SnO_2$, $Ga_2O_3$, and ZnO, A is at least one selected from $LaF_3$ and $CeF_3$, and x satisfies $50 \leq x \leq 95$. With this sputtering target, a material layer containing a material expressed by the composition formula (6) can be formed.

Hereinafter, embodiments of the present invention will be described with reference to the accompanying drawings. The following embodiments are illustrative and the present invention is not limited to the following embodiments.

Embodiment 1

As Embodiment 1 of the present invention, an example of an information recording medium on/from which information is recorded/reproduced using laser light will be described. FIG. 1 shows a partial cross-sectional view of the information recording medium.

As shown in FIG. 1, the information recording medium of this embodiment has the following structure. A first dielectric layer 2, a recording layer 4, a second dielectric layer 6, a light-absorption correction layer 7 and a reflective layer 8 are formed on one surface of a substrate 1 in this order. Furthermore, an attachment substrate 10 is attached to the reflective layer 8 with an adhesive layer 9. The information recording medium having this structure can be used as 4.7 GB/DVD-RAM on/from which information is recorded/reproduced with laser beams in a red region of a wavelength in the vicinity of 660 nm. Laser light is incident on the information recording medium having this structure from the side of the substrate 1, and thus information is recorded and reproduced by the incident laser light. The information recording medium of this embodiment is different from the conventional information recording medium shown in FIG. 6 in that the interface layers are not included between the recording layer 4 and each of the first dielectric layer 2 and the second dielectric layer 6.

The substrate 1 generally is a transparent disk-like plate. As shown in FIG. 1, guide grooves for guiding laser light may be formed on a surface of the substrate 1 on which the first dielectric layer 2 and the recording layer 4 or the like are to be formed. When guide grooves are formed on the substrate 1, groove portions and land portions are formed when the cross-section of the substrate is viewed. It can be said that the groove portions are positioned between two adjacent land portions. Therefore, the surface of the substrate 1 provided with the guide grooves has a top face and a bottom face that are connected by side walls. In this specification, the face nearer to the laser light is referred to as "groove face" for convenience, and the surface farther from the laser light is referred to as "land face" for convenience. In FIG. 1, the bottom face 20 of the guide grooves in the substrate 1 corresponds to the groove face, and the top face 21 corresponds to the land face. This applies to the information recording medium shown in FIG. 2 that will be described in Embodiment 2 later.

The step between the groove face 20 and the land face 21 of the substrate 1 preferably is 40 nm to 60 nm. Also in the substrate 1 constituting the information recording media shown in FIG. 2, it is preferable that the step between the groove face 20 and the land face 21 is in this range. In the substrate 1, it is preferable that the other surface on which no layer is formed is smooth. As a material of the substrate 1, resin such as polycarbonate, amorphous polyolefin or polymethyl methacrylate (PMMA) or a material having optical transparency such as glass can be used. In view of the formability, the cost, and the mechanical strength, polycarbonate is used preferably. In the information recording medium of this embodiment, the thickness of the substrate 1 is about 0.5 to 0.7 mm.

The recording layer 4 in this embodiment is a layer in which a recording mark is formed by light irradiation or application of electric energy to cause phase change between a crystalline phase and an amorphous phase. If the phase change is reversible, erasure and rewriting can be performed. As a reversible phase change material, it is preferable to use Ge—Sb—Te or Ge—Sn—Sb—Te, which are high speed crystallization materials. More specifically, in the case of Ge—Sb—Te, a GeTe—$Sb_2Te_3$ pseudo-binary system composition is preferable. In this case, it is preferable that $4Sb_2Te_3 \leq GeTe \leq 50Sb_2Te_3$ is satisfied. In the case of GeTe<$4Sb_2Te_3$, the change in the reflected light amount between before and after recording is small so that the quality of read-out signals is deteriorated. In the case of $50Sb_2Te_3$<GeTe, the change in volume between the crystalline phase and the amorphous phase is large, and the repeated rewriting performance is deteriorated. Ge—Sn—Sb—Te has a higher crystallization rate than that of Ge—Sb—Te. Ge—Sn—Sb—Te is, for example, a substance in which a part of Ge of a GeTe—$Sb_2Te_3$ pseudo-binary composition is substituted with Sn. In the recording layer 4, it is preferable that the content of Sn is 20 atom % or less. When the content of Sn exceeds 20 atom %, the crystallization rate is too high, and therefore the stability of the amorphous phase is impaired, and the reliability of recording marks is deteriorated. The content of Sn can be adjusted in accordance with the recording conditions.

The recording layer 4 can be formed of a material containing Bi such as Ge—Bi—Te, Ge—Sn—Bi—Te, Ge—Sb—Bi—Te, or Ge—Sn—Sb—Bi—Te. Bi is crystallized more readily than Sb. Therefore, the crystallization rate of the recording layer can be improved by substituting at least a part of Sb of Ge—Sb—Te or Ge—Sn—Sb—Te with Bi.

Ge—Bi—Te is a mixture of GeTe and $Bi_2Te_3$. In this mixture, it is preferable that $8Bi_2Te_3 \leq GeTe \leq 25Bi_2Te_3$ is satisfied. In the case of $GeTe<8Bi_2Te_3$, the crystallization temperature is reduced, and the archival characteristic tends to be deteriorated. In the case of $25Bi_2Te_3<GeTe$, the change in volume between the crystalline phase and the amorphous phase is large, and the repeated rewriting performance is deteriorated.

Ge—Sn—Bi—Te corresponds to a substance in which a part of Ge of Ge—Bi—Te is substituted with Sn. It is possible to control the crystallization rate in accordance with the recording conditions by adjusting the concentration of substitution with Sn. Sn substitution is more suitable for fine tuning of the crystallization rate of the recording layer 4 than Bi substitution. In the recording layer 4, it is preferable that the content of Sn is 10 atom % or less. When it exceeds 10 atom %, the crystallization rate is too high, and therefore the stability of the amorphous phase is impaired, and the preservability of recording marks is deteriorated.

Ge—Sn—Sb—Bi—Te corresponds to a substance in which a part of Ge of Ge—Sb—Te is substituted with Sn, and a part of Sb is substituted with Bi. This corresponds to a mixture of GeTe, SnTe, $Sb_2Te_3$ and $Bi_2Te_3$. In this mixture, it is possible to control the crystallization rate in accordance with the recording conditions by adjusting the Sn substitution concentration and the Bi substitution concentration. In Ge—Sn—Sb—Bi—Te, it is preferable that $4(Sb—Bi)_2Te_3 \leq (Ge—Sn)Te \leq 25(Sb—Bi)_2Te_3$ is satisfied. In the case of $(Ge—Sn)Te<4(Sb—Bi)_2Te_3$, the change in the reflected light amount between before and after recording is small so that the quality of read-out signals is deteriorated. In the case of $25(Sb—Bi)_2Te_3<(Ge—Sn)Te$, the change in volume between the crystalline phase and the amorphous phase is large, and the repeated rewriting performance is deteriorated. In the recording layer 4, it is preferable that the content of Bi is 10 atom % or less and that the content of Sn is 20 atom % or less. When the contents of Bi and Sn are in the above-described ranges, good preservability of recording marks can be obtained.

As other materials causing reversible phase change, for example, materials containing Ag—In—Sb—Te, Ag—In—Sb—Te—Ge or Sb—Te containing 70 atom % or more of Sb can be used.

As an irreversible phase change material, it is preferable to use $TeOx+\alpha$ ($\alpha$ is Pd, Ge or the like), for example (see JP7-25209B (Japanese Patent No. 2006849). The information recording medium in which the recording layer 4 is made of an irreversible phase change material is a so-called write-once type, which allows recording only once. In such an information recording medium as well, there is a problem in that atoms in the dielectric layer are diffused into the recording layer due to heat during recording, and the quality of signals deteriorates. Therefore, the structure of the information recording medium of the present invention can apply preferably, not only to a rewritable information recording medium, but also to a write-once type information recording medium.

When the recording layer 4 is formed of a material whose phase is changed reversibly, it is preferable that the thickness of the recording layer 4 is 15 nm or less, and more preferably 12 nm or less. The lower limit of the recording layer 4 is not limited to a particular value, but it is preferable that it is 3 nm or more.

The first dielectric layer 2 and the second dielectric layer 6 in this embodiment are oxide-based material layers or oxide-nitride-based material layers formed of a material containing an oxide of at least one element selected from the group GM consisting of Sn, Ga and Zn, and at least one of an oxide and a nitride of at least one element selected from the group GL consisting of Al, Si and B. The first dielectric layer 2 and the second dielectric layer 6 in this embodiment may be oxide-fluoride-based material layers formed of a material containing an oxide of at least one element selected from the group GM consisting of Sn, Ga and Zn, and at least one of a fluoride of at least one element selected from the group GA consisting of La and Ce.

In general, for the material of the dielectric layers of an information recording medium, the following properties are required: (1) being transparent; (2) having a recording sensitivity equal to or higher than that of the structure in which an interface layer is provided between the dielectric layer and the recording layer; (3) having a high melting point so as not to melt during recording; (4) having a high film-forming speed; and (5) having good adhesion with a recording layer 4 that is made of chalcogenide. Being transparent is a property necessary for letting the laser light 12 incident from the side of the substrate 1 pass through the dielectric layer and reach the recording layer 4. This property is required especially for the first dielectric layer 2 on the light-incident side. Furthermore, it is necessary to select the material of the first and the second dielectric layers 2 and 6 such that the obtained information recording medium has a recording sensitivity equal to or higher than that of the conventional information recording medium in which interface layers are provided between the dielectric layers made of $(ZnS)_{80}(SiO_2)_{20}$ (mol %) and the recording layer. Having a high melting point is a property necessary for ensuring that the recording layer 4 is not contaminated by the material of the first and the second dielectric layers 2 and 6 when being irradiated with laser light in the peak power level, and is required for both the first and the second dielectric layers 2 and 6. When the recording layer 4 is contaminated by the material of the first and the second dielectric layers 2 and 6, the repeated rewriting performance is deteriorated significantly. Having a high film-forming speed is required for good productivity. Having good adhesion with the recording layer 4 that is made of chalcogenide is a property necessary for ensuring the reliability of the information recording medium, and is required for both the first and the second dielectric layers 2 and 6.

Among the components contained in the oxide-based material layer, the oxide-nitride-based material layer or oxide-fluoride-based material layer, all of the oxides of the elements constituting the group GM have transparency, high melting points, excellent thermal stability, and good adhesion with the recording layer. Therefore, these compounds ensure good repeated rewriting performance of the information recording medium. The oxides of Si and Al, which are elements constituting the group GL, have excellent moisture resistance, reduce the thermal conductivity by being mixed with oxides of an element constituting the group GM so as to improve the recording sensitivity, and soften the film so that film cracking or film rupture due to repeated rewriting recording can be suppressed. Therefore, with the oxides of Si and Al, the recording sensitivity and the reliability of the information recording medium can be obtained. For example, the oxides of the elements constituting the group GM may contain $SnO_2$, $Ga_2O_3$ and ZnO. For example, the oxides of Si and Al may contain $SiO_2$ and $Al_2O_3$.

An information recording medium having excellent repeated rewriting performance and good adhesion between the recording layer 4 and the first and the second dielectric layers 2 and 6 can be achieved by forming the first and the second dielectric layers 2 and 6 with a material made of a mixture of the above-described oxides and free from S such that the first and second dielectric layers 2 and 6 are in contact with the recording layer 4. Furthermore, the thermal conductivity in the first and the second dielectric layers 2 and 6 can be suppressed by making the structure of the layers complicated by mixing oxides of Si or Al with oxides of an element constituting the group GM. Therefore, if the above-described oxide-based material layer is used as the first and the second dielectric layers 2 and 6, the effect of cooling the recording layer 4 can be enhanced, so that the recording sensitivity of the information recording medium can be increased.

Among components contained in the oxide-nitride-based material layer, nitrides of an element constituting the group GL include AlN, $Si_3N_4$ and BN, for example. All of these nitrides have high melting points, good moisture resistance, and can reduce the thermal conductivity by being mixed with oxides of an element constituting the group GM to make the structure of the oxides complicated so as to improve the recording sensitivity.

A specific example of such an oxide-nitride-based material layer is one containing a material in which a nitride is used as E in the composition formula (3), that is, $(D)_X(E)_{100-X}$ (mol %). In this formula, D is at least one oxide selected from $SnO_2$, $Ga_2O_3$ and ZnO. E is a nitride and at least one selected from $Si_3N_4$ and AlN. X, which indicates the mixing ratio of each compound, satisfies $50 \leq X \leq 95$. When the mixing ratio of D is less than 50 mol %, the adhesion with the recording layer is not sufficient, and the rewriting characteristics may tend to be reduced, the film-forming speed may be reduced, and the productivity hardly increases. When the mixing ratio of D is more than 95 mol %, the effect of the mixing of $Si_3N_4$ and AlN hardly is exhibited, and in particular, this ratio is not sufficient to improve the recording sensitivity.

Another specific example of the oxide-nitride-based material layer is one containing a material expressed by the composition formula (4), that is, $(SnO_2)_{A1}(Ga_2O_3)_{A2}(E1)_B$ (mol %). E1 is at least one nitride selected from $Si_3N_4$ and AN. Herein, A1 and A2 satisfy $50 \leq A1+A2 \leq 95$, and either one of A1 and A2 may be 0 and it is sufficient that at least one of $SnO_2$ and $Ga_2O_3$ is contained. B satisfies $5 \leq B \leq 50$. A1+A2 is in such a value range for the same reason as that for the composition formula (3). When the ratio of $Si_3N_4$ and AlN exceeds the upper limit (50 mol %), the adhesion with the recording layer 4 deteriorates, and when it is less than 5 mol %, the recording sensitivity is not sufficient.

Furthermore, the dielectric layer can be formed of an oxide or oxide-nitride-based material expressed by the composition formula containing an oxide of Si, that is, $(D)_X(SiO_2)_Y(E1)_{100-X-Y}$ (mol %). Herein, D is at lease one oxide selected from $SnO_2$, $Ga_2O_3$, and ZnO, and E1 is at least one nitride selected from $Si_3N_4$ and AlN. X and Y, which indicate the mixing ratio, satisfy $50 \leq X \leq 95$, $5 \leq Y \leq 35$, and $55 \leq X+Y \leq 100$. X is in such a value range for the same reason as that for the composition formula (3). Y is in such a value range for the following reason. When Y is less than 5, the effect of softening the film so as to suppress peeling of the film by rewriting is insufficient, and when Y exceeds the upper limit of 35, the effect of improving the recording sensitivity hardly is obtained, and the film-forming speed is reduced, so that the productivity is not increased.

Another specific example of the oxide-fluoride-based material is a material expressed by the composition formula (6), that is, $(D)_X(A)_{100-X}$ (mol %) (6). Herein, D is at least one oxide selected from $SnO_2$, $Ga_2O_3$, and ZnO, A is at least one fluoride selected from $LaF_3$ and $CeF_3$, and X, which indicates the mixing ratio, satisfies 50 5×5 95. X is in such a value range for the same reason as that for the composition formulae (3) to (5).

Good recording sensitivity, rewriting characteristics and reliability can be obtained by forming the dielectric layer with the oxide-based material, the oxide-nitride-based material or the oxide-fluoride-based material, even if the dielectric layer is formed in contact with the recording layer.

The oxide-based material, the oxide-nitride-based material and the oxide-fluoride-based material may contain a third component other than the compounds shown above, and in particular, may contain impurities in several % or less. The thermal stability and the moisture resistance are not changed even if a composition element of a layer formed in the vicinity is slightly mixed, and this layer preferably can be used as the first dielectric layer 2 and the second dielectric layer 6. The third component is a substance that is inevitably contained or a substance that is inevitably formed when forming a dielectric layer with the oxide-based material, the oxide-nitride-based material or the oxide-fluoride-based material. As the third component, for example, dielectrics, metal, semi-metal, semiconductors, and non-metal can be contained.

Examples of dielectrics contained as the third component include $Bi_2O_3$, $CeO_2$, CoO, $Cr_2O_3$, CuO, $Cu_2O$, $Er_2O_3$, FeO, $Fe_2O_3$, $Fe_3O_4$, $Ho_2O_3$, $In_2O_3$, $La_2O_3$, MnO, $MgSiO_3$, $Nb_2O_5$, $Nd_2O_3$, NiO, $Sc_2O_3$, $Sm_2O_3$, SnO, $Ta_2O_5$, $Tb_4O_7$, $TeO_2$, $TiO_2$, VO, $WO_3$, $Y_2O_3$, $Yb_2O_3$, $ZrO_2$, $ZrSiO_4$, $CrB_2$, $LaB_6$, $ZrB_2$, CrN, $Cr_2N$, HfN, NbN, TaN, TiN, VN, ZrN, $B_4C$, $Cr_3C_2$, HfC, $Mo_2C$, NbC, SiC, TaC, TiC, VC, $W_2C$, WC and ZrC.

Examples of metal contained as the third component include Sc, Y, Ti, Zr, Hf, V, Nb, Ta, Cr, Mo, W, Mn, Fe, Ni, Pd, Pt, Cu, Ag, Au, Zn, La, Ce, Nd, Sm, Gd, Tb, Dy and Yb.

Examples of semi-metal and semiconductors contained as the third component include C and Ge. Examples of non-metal include Sb, Bi, Te, and Se.

The first dielectric layer 2 and the second dielectric layer 6 may be formed of oxide-based material layers, oxide-nitride-based material layers or oxide-fluoride-based material layers having different compositions from each other. It is preferable for the first dielectric layer to be formed of a material having a composition that provides better moisture resistance, and for example, it is preferable to use $(SnO_2)_{40}(Ga_2O_3)_{40}(SiO_2)_{20}$ (mol %) that is a material expressed by the composition formula (5), that is, $(D)_X(SiO_2)_Y(E11)_{100-X-Y}$(mol %), in which D is $SnO_2$ and $Ga_2O_3$ and E1 is not contained. It is preferable for the second dielectric layer 6 to be formed of a material having a composition that provides a large effect of cooling the recording layer, and for example, it is preferable to use $(SnO_2)_{35}(Ga_2O_3)_{40}(Si_3N_4)_{25}$ (mol %) that is a material expressed by the composition formula (4), that is, $(SnO_2)_{A1}(Ga_2O_3)_{A2}(E1)_B$ (mol %), in which E1 is $Si_3N_4$.

The first dielectric layer 2 and the second dielectric layer 6 may be formed of the same material or different materials. For example, the first dielectric layer 2 can be formed of a mixed material of ZnO—$Si_3N_4$—$SiO_2$, and the second dielectric layer 6 can be formed of a mixed material of $SnO_2$—$Ga_2O_3$—$LaF_3$. Thus, the oxide-based material, the oxide-nitride-based material and the oxide-fluoride-based material used for the first dielectric layer 2 and the second dielectric layer 6 can be formed by optimizing the kind of oxide, nitride and fluoride and the mixture ratio thereof in accordance with a desired function.

The first dielectric layer 2 and the second dielectric layer 6 can adjust the light absorptance Ac (%) of the recording layer 4 in the crystalline phase and the light absorptance Aa (%) of the recording layer 4 in the amorphous phase, the light reflectance Rc (%) of the information recording medium when the recording layer 4 is in the crystalline phase and the light reflectance Ra (%) of the information recording medium when the recording layer 4 is in the amorphous phase, and the phase difference Δφ of light between a crystalline portion and an amorphous portion of the recording layer 4 of the information recording medium by changing the optical path length (i.e., a product nd of the refractive index n of the dielectric layers and the thickness d of the dielectric layers). In order to improve the signal quality by increasing the reproduction signal amplitude of a recording mark, it is preferable that the difference in the reflectance (|Rc−Ra|) or the reflectance ratio (Rc/Ra) is large. Furthermore, it also is preferable that Ac and Aa are large so that the recording layer 4 absorbs laser light. The optical path lengths of the first dielectric layer 2 and the second dielectric layer 6 are determined so as to satisfy these conditions at the same time. The optical path lengths that satisfy these conditions can be determined precisely by calculations based on a matrix method (e.g., see the third chapter of "Wave Optics" by Hiroshi Kubota, published by Iwanami Shoten, 1971).

The above-described oxide-based material layer, oxide-nitride-based material layer and oxide-fluoride-based material layer have a refractive index that varies depending on the composition. The optical path length nd can be expressed as nd=aλ, where n is the refractive index of the dielectric layer, d (nm) is the thickness, and λ (nm) is the wavelength of the laser light. Here, a is a positive number. In order to improve the signal quality by increasing the reproduction signal amplitude of a recording mark of the information recording medium, for example, it is preferable that 15%≦Rc and Ra≦2%. In order to eliminate or minimize mark strain due to rewriting, it is preferable to satisfy 1.1≦Ac/Aa. The optical path lengths (aλ) of the first dielectric layer 2 and the second dielectric layer 6 were obtained precisely so as to satisfy these preferable conditions at the same time by calculations based on a matrix method. The thickness d of the dielectric layers was obtained based on the obtained optical path length (aλ), and λ and n. As a result, it was found out that, for example, when the first dielectric layer 2 was formed of a material expressed by composition formula (4), i.e., $(SnO_2)_{A1}(Ga_2O_3)_{A2}(E1)_B$ (mol %) and having a refractive index n of 1.8 to 2.3, the thickness preferably was 110 nm to 160 nm. It also was found out that when the second dielectric layer 6 was formed of this material, the thickness preferably was 35 nm to 60 nm.

The light-absorption correction layer 7 serves to adjust the ratio Ac/Aa of the light absorptance Ac when the recording layer 4 is in a crystalline state and the light absorptance Aa when the recording layer 4 is in an amorphous state, and prevent the mark shape from being distorted at the time of rewriting. It is preferable that the light-absorption correction layer 7 is formed of a material that has a high refractive layer and absorbs light in a suitable amount. For example, the light-absorption correction layer 7 can be formed of a material having a refractive index n of 3 or more and 5 or less and an extinction coefficient k of 1 or more and 4 or less. More specifically, it is preferable to use a material selected from amorphous Ge alloys such as Ge—Cr and Ge—Mo, amorphous Si alloys such as Si—Cr, Si—Mo, and Si—W, tellurides and crystalline metals, semi-metal and semiconductor materials such as Ti, Zr, Nb, Ta, Cr, Mo, W, SnTe and PbTe. It is preferable that the thickness of the light-absorption correction layer 7 is 20 nm to 60 nm.

The reflective layer 8 serves to facilitate the change of the recording layer into an amorphous state, optically by increasing the light amount that is absorbed by the recording layer 4 and thermally by diffusing heat generated in the recording layer 4, rapidly to cool the recording layer 4 rapidly. Furthermore, the reflective layer 8 also serves to protect the multilayer including the recording layer 4, the dielectric layers 2 and 6 from the use environment. As a material of the reflective layer 8, for example, a single metal material having a high thermal conductivity such as Al, Au, Ag, and Cu can be used. The reflective layer 8 may be formed of a material in which another element or a plurality of other elements are added to one or a plurality of elements selected from the aforementioned metal materials for the purpose of improving the moisture resistance and/or adjusting the thermal conductivity or optical characteristics (i.e., light reflectance, light absorptance or light transmission). More specifically, alloy materials such as Al—Cr, Al—Ti, Ag—Pd, Ag—Pd—Cu, Ag—Pd—Ti, or Au—Cr can be used. All of these materials have excellent corrosion resistance and a rapid cooling function and thus are excellent materials. The same purposes also can be attained by forming the reflective layer 8 with at least two layers. The thickness of the reflective layer 8 preferably is 50 to 180 nm, and more preferably 60 nm to 100 nm.

The adhesive layer 9 may be formed of a material having high heat resistance and high adhesion, for example, an adhesive resin such as UV curable resin. More specifically, a photocurable material having acrylic resin or methacrylic resin as the main component, a material having epoxy resin as the main component, a hot-melt material or the like can be used. A protective coating layer with a thickness of 2 to 20 μm that is made of UV curable resin may be provided on a surface of the reflective layer 8, if necessary, before forming the adhesive layer 9. The thickness of the adhesive layer 9 preferably is 15 to 40 μm, and more preferably 20 to 35 μm.

The attachment substrate 10 serves to enhance the mechanical strength of the information recording medium and protect the laminate from the first dielectric layer 2 to the reflective layer 8. The preferable material of the attachment substrate 10 is the same as that of the substrate 1.

The information recording medium of this embodiment is a one-surface disk having one recording layer. However, the present invention is not limited thereto, and may have two recording layers.

Next, a method for producing the information recording medium of this embodiment will be described.

The information recording medium of this embodiment is produced by performing the step (step a) of arranging the substrate 1 (e.g., thickness: 0.6 mm) provided with guide grooves (groove faces 20 and land faces 21) in a film forming apparatus and forming the first dielectric layer 2 on the surface on which the guide grooves are formed of the substrate 1, the step (step b) of forming the recording layer 4, the step (step c) of forming the second dielectric layer 6, the step (step d) of forming the light-absorption correction layer 7 and the step (step e) of forming the reflective layer 8 in this order, further by performing the step of forming the adhesive layer 9 on the surface of the reflective layer 8 and the step of attaching the attachment substrate 10. In this specification, with respect to each layer, when "surface" is referred to, unless otherwise, it refers to the surface exposed when each layer is formed (surface perpendicular to the thickness direction).

Figure 5:
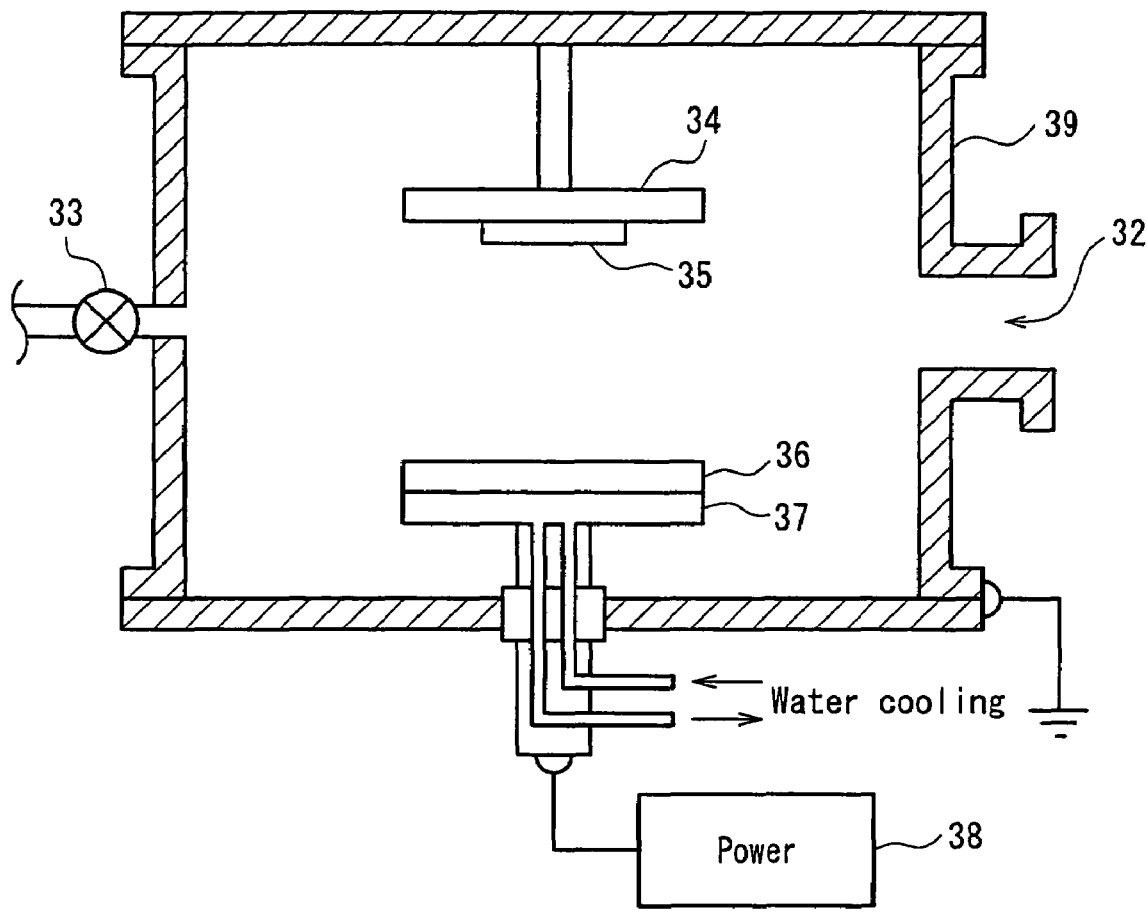
FIG. 5 is a schematic view showing an example of a sputtering apparatus used in a method for producing an information recording medium of the present invention.

First, the step a of the forming the first dielectric layer 2 on the surface on which the guide grooves are formed of the substrate 1 is performed. The step a is performed by sputtering. First, an example of a sputtering apparatus used in this embodiment will be described. FIG. 5 shows the manner in which a film is formed with a sputtering apparatus. As shown in FIG. 5, this sputtering apparatus is configured such that a vacuum pump (not shown) is connected to a vacuum container 39 through an exhaust port 32, and a high vacuum is maintained in the vacuum container 39. A predetermined flow rate of gas can be supplied from a gas supply port 33. A substrate 35 (the substrate herein refers to a base material on which films are deposited) is mounted on a positive electrode 34. The vacuum container 39 and the substrate 35 are maintained to be positive by grounding the vacuum container 39. A sputtering target 36 is connected to a negative electrode 37, and is connected to a power source via a switch (not shown). A thin film is formed on the substrate 35 with particles released from the sputtering target 36 by applying a predetermined voltage between the positive electrode 34 and the negative electrode 37. The same apparatus can be used in sputtering in the following steps. The sputtering in the step a is performed in an Ar gas atmosphere using a high frequency power. As the gas to be introduced for sputtering, other than Ar gas, a mixed gas atmosphere of oxygen gas, nitrogen gas and the like, can be used, depending on a material layer to be formed.

As the sputtering target used in the step a, a sputtering target containing an oxide of at least one element selected from the group GM consisting of Sn, Ga and Zn, and at least one of an oxide and a nitride of at least one element selected from the group GL consisting of Al, Si and B; or a sputtering target containing an oxide of at least one element selected from the group GM, and a fluoride of at least one element selected from the group GA consisting of La and Ce is used. As such a sputtering target, as a result of element analysis, for example, a material expressed by the composition formulae (7) and (8) are used preferably. With such a sputtering target, the dielectric layers 2 and 6 can be formed of oxide-based material layers, oxide-nitride-based material layers or oxide-fluoride-based material layers containing the material expressed by the composition formulae (1) and (2).

As described above, a sputtering target containing one or a plurality of elements selected from the group GM, and one or a plurality of elements selected from the group GL or one or a plurality of elements selected from the group GA, and oxygen (O), and if necessary, nitrogen (N) or fluorine (F) is provided in the form of a mixture of oxide of an element(s) of the group GM and at least one of oxide and nitride of an element(s) of the group GL or fluoride of an element(s) of the group GA. It is preferable that the sputtering target used in the production method of this embodiment contains 50 mol % or more, more preferably 50 to 90 mol % of the oxide group of an element selected from the group GM with respect to the mixture.

As the sputtering target containing the above-described specific oxide and nitride, a material containing at least one oxide selected from $SnO_2$, $Ga_2O_3$ and ZnO and at least one compound selected from AlN, $Si_3N_4$, $Al_2O_3$ and $SiO_2$ can be used. More specifically, a target containing a material expressed by the composition formula (9), that is, $(D)_x(E)_{100-x}$ (mol %) (where D is at least one oxide selected from $SnO_2$, $Ga_2O_3$ and ZnO, E is at least one compound selected from AlN, $Si_3N_4$, $Al_2O_3$ and $SiO_2$, and x satisfies $50 \leq x \leq 95$) can be used. With this sputtering target, a layer containing a material expressed by the composition formula (3) can be formed.

As the sputtering target, one containing $SnO_2$ and $Ga_2O_3$ may be used. More specifically, a target containing a material expressed by the composition formula (10), that is, $(SnO_2)_{a1}(Ga_2O_3)_{a2}(E1)_b$ (mol %) (where E1 is at least one nitride selected from AlN and $Si_3N_4$, a1 and a2 satisfies $50 \leq a1+a2 \leq 95$, either one of a1 and a2 may be 0, and b satisfies $5 \leq b \leq 50$) is preferable. With this sputtering target, a layer containing a material expressed by the composition formula (4) can be formed.

As the sputtering target, one containing $SiO_2$ may be used, or one containing a material expressed by the formula (11), that is, $(D)_x(SiO_2)_y(E1)_{100-x-y}$ (mol %) (where D is at least one oxide selected from $SnO_2$, $Ga_2O_3$, and ZnO, E1 is at least one nitride selected from AlN and $Si_3N_4$, x and y satisfy $50 \leq x \leq 95$, $5 \leq y \leq 35$, and $55 \leq x+y \leq 100$) may be used. With this sputtering target, a layer containing a material expressed by the composition formula (5) can be formed.

Alternatively, a sputtering target containing an oxide of an element selected group GM and a fluoride of an element selected group GA can be used. More specifically, a target containing a material expressed by the composition formula (12), that is, $(D)_x(A)_{100-x}$ (mol %) (where D is at least one oxide selected from $SnO_2$, $Ga_2O_3$, and ZnO, A is at least one selected from $LaF_3$ and $CeF_3$, and x satisfies $50 \leq x \leq 95$) may be used. With this sputtering target, a layer containing a material expressed by the composition formula (6) can be formed.

The layers containing the above-described materials may contain a third component other than the compounds shown above, and in particular, may contain impurities in several % or less. The elemental composition at a layer boundary may be slightly mixed. The components that can be contained as the third component are as described above for example.

Next, the step b is performed to form the recording layer 4 on the surface of the first dielectric layer 2. The step b also is performed by sputtering. Sputtering is performed in an Ar gas atmosphere or a mixed gas atmosphere of Ar gas and $N_2$ gas, using a direct current power. Similarly to step a, other gas can be introduced, depending on the purpose. As the sputtering target, a sputtering target containing any one material selected from the group consisting of Ge—Sb—Te, Ge—Sn—Sb—Te, Ge—Bi—Te, Ge—Sn—Bi—Te, Ge—Sb—Bi—Te, Ge—Sn—Sb—Bi—Te, Ag—In—Sb—Te and Sb—Te is used. The recording layer 4 that has been formed is in an amorphous state.

Next, the step c is performed to form the second dielectric layer 6 on the surface of the recording layer 4. The step c is performed in the same manner as the step a. The second dielectric layer 6 can be formed by using a sputtering target containing the same compound as the first dielectric layer 2 but at a different mixing ratio, or a sputtering target containing different compounds. For example, the first dielectric layer 2 can be formed of a mixed material of ZnO—$Si_3N_4$—$SiO_2$, and the second dielectric layer 6 can be formed of a mixed material of $SnO_2$—$Ga_2O_3$—$LaF_3$. Thus, the first dielectric layer 2 and the second dielectric layer 6 can be formed by optimizing the kind of oxide, nitride and fluoride contained, and/or the mixing ratios thereof, depending on the desired functions.

Next, the step d is performed to form the light-absorption correction layer 7 on the surface of the second dielectric layer 6. In the step d, sputtering is performed, using a direct current power or a high frequency power. As the sputtering target, a material may be selected from amorphous Ge alloys such as Ge—Cr and Ge—Mo, amorphous Si alloys such as Si—Cr, Si—Mo and Si—W, tellurides, and crystalline metals, semi-metal and semiconductor materials such as Ti, Zr, Nb, Ta, Cr, Mo, W, SnTe and PbTe. In general, sputtering is performed in an Ar gas atmosphere.

Next, the step e is performed to form the reflective layer 8 on the surface of the light-absorption correction layer 7. The step e is performed by sputtering. The sputtering is performed in an Ar gas atmosphere, using a direct current power or a high frequency power. As the sputtering target, an alloy sputtering target such as Al—Cr, Al—Ti, Ag—Pd, Ag—Pb—Cu, Ag—Pd—Ti and Au—Cr can be used.

As described above, all of the steps a to e are sputtering steps. Therefore, the steps a to e may be performed continuously while sequentially changing targets in one sputtering apparatus. Alternatively, the steps a to e may be performed, using independent sputtering apparatuses.

After the reflective layer 8 is formed, the substrate 1 on which the layers from the first dielectric layer 2 to the reflective layer 8 are laminated sequentially is removed from the sputtering apparatus. Then, UV curable resin is applied to the surface of the reflective layer 8 by, for example, spin-coating. The attachment substrate 10 is attached to the applied UV curable resin, followed by irradiation of ultraviolet rays from the side of the attachment substrate 10 to cure the resin. Thus, the attachment step ends.

After the attachment step ends, if necessary, an initialization step is performed. The initialization step is a step in which the recording layer 4 in an amorphous state is, for example, irradiated with a semiconductor laser to be heated to a crystallization temperature for crystallization. The initialization step may be performed before the attachment step. Thus, the steps a to e, the step of forming the adhesive layer and the step of attaching the attachment substrate 10 are performed sequentially, so that the information recording medium of Embodiment 1 can be produced.

Embodiment 2

Figure 2:
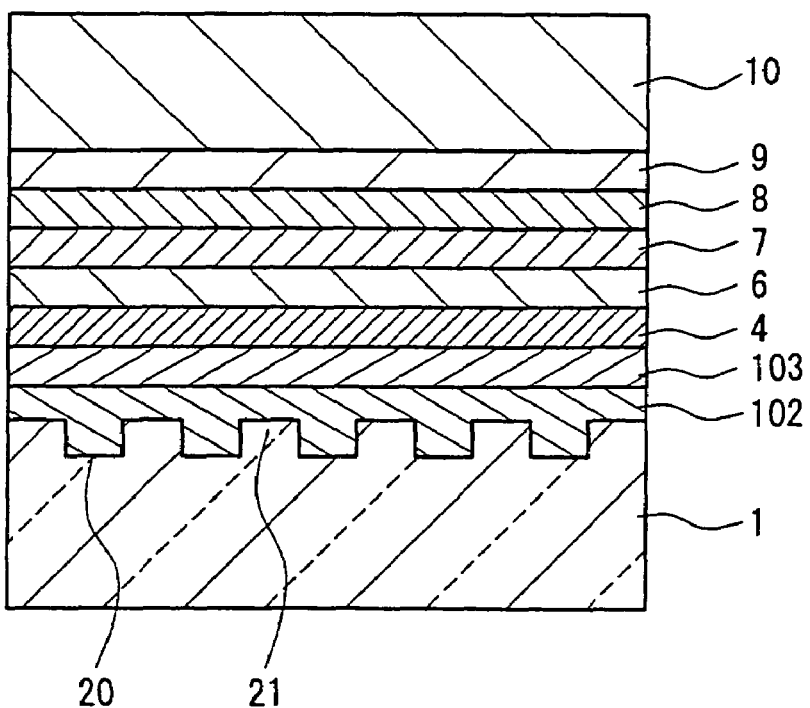
FIG. 2 is a partial cross-sectional view showing an example of an information recording medium of Embodiment 2 of the present invention.

As Embodiment 2 of the present invention, an example of an information recording medium on/from which information is recorded/reproduced using laser light will be described. FIG. 2 is a partial cross-sectional view of the information recording medium.

An information recording medium of this embodiment shown in FIG. 2 has the following structure. A first dielectric layer 102, an interface layer 103, a recording layer 4, a second dielectric layer 6, a light-absorption correction layer 7 and a reflective layer 8 are formed on one surface of a substrate 1 in this order. Furthermore, an attachment substrate 10 is attached to the reflective layer 8 with an adhesive layer 9. The information recording medium of this embodiment is different from the conventional information recording medium shown in FIG. 6 in that no interface layer is formed between the recording layer 4 and the second dielectric layer 6. This information recording medium is different from the information recording medium of Embodiment 1 shown in FIG. 1 in that the first dielectric layer 102 and the interface layer 103 are laminated in this order between the substrate 1 and the recording layer 4. In this embodiment, the second dielectric layer 6 is an oxide-based material layer, an oxide-nitride-based material layer or an oxide-fluoride-based material layer as the first and the second dielectric layers in the information recording medium of Embodiment 1. In addition, in FIG. 2, the same reference numerals as those used in FIG. 1 denote components having the same function that are formed of the material and by the method described with reference to FIG. 1. Therefore, the elements that already have been described with reference to FIG. 1 will not be described further.

In the information recording medium of this embodiment, the first dielectric layer 102 is formed of a material used for the dielectric layer constituting the conventional information recording medium $((ZnS)_{80}(SiO_2)_{20}$ (mol %)). Therefore, the interface layer 103 is provided to prevent substance movement that might be caused between the first dielectric layer 102 and the recording layer 4 by repeated recording. Regarding the preferable material and thickness of the interface layer 103, for a mixed material such as $ZrO_2$—$SiO_2$—$Cr_2O_3$ or Ge—Cr, the thickness thereof preferably is 1 to 10 nm, more preferably 2 to 7 nm. When the thickness of the interface layer 103 is too large, the light reflectance and the light absorptance of a laminate from the first dielectric layer 102 to the reflective layer 8 formed on the surface of the substrate 1 are changed, which affects the recording and erasure performance.

Next, a method for producing an information recording medium of this embodiment will be described. In this embodiment, an information recording medium is produced by performing the step (step h) of forming the first dielectric layer 102 on the surface on which guide grooves are formed of the substrate 1, the step (step i) of forming the first interface layer 103, the step (step b) of forming the recording layer 4, the step (step c) of forming the second dielectric layer 6, the step (step d) of forming the light-absorption correction layer 7 and the step (step e) of forming the reflective layer 8 in this order, further by performing the step of forming the adhesive layer 9 on the surface of the reflective layer 8 and the step of attaching the attachment substrate 10. The steps b, c, d and e are performed in the same manner as described in Embodiment 1, and are not described further in this embodiment. After the step of attaching the attachment substrate 10 ends, as described with reference to Embodiment 1, an initialization step is performed, if necessary, and thus an information recording medium can be obtained.

As above, information recording media for recoding and reproducing information with laser light have been described in Embodiments 1 and 2 as embodiments of the information recording medium of the present invention with reference to FIGS. 1 and 2. However, the information recording medium of the present invention is not limited to these embodiments. The information recording medium of the present invention can take any form, as long as it employs an oxide-based material layer, an oxide-nitride-based material layer or an oxide-fluoride-based material layer as described above. That is to say, the present invention can be applied, regardless of the order of forming the layers on the substrate, the number of the recording layers, the recording conditions, the recording capacity and the like. The information recording medium of the present invention is suitable for recording in various wavelengths. Therefore, the structure and the production method of the information recording medium of the present invention may be applied to, for example, DVD-RAM or DVD-RW (digital versatile disk-recordable) for recording and reproduction with laser light with a wavelength 630 to 680 nm or a large capacity optical disk for recording and reproduction with laser light with a wavelength 400 to 450 nm.

Embodiment 3

Figure 3:
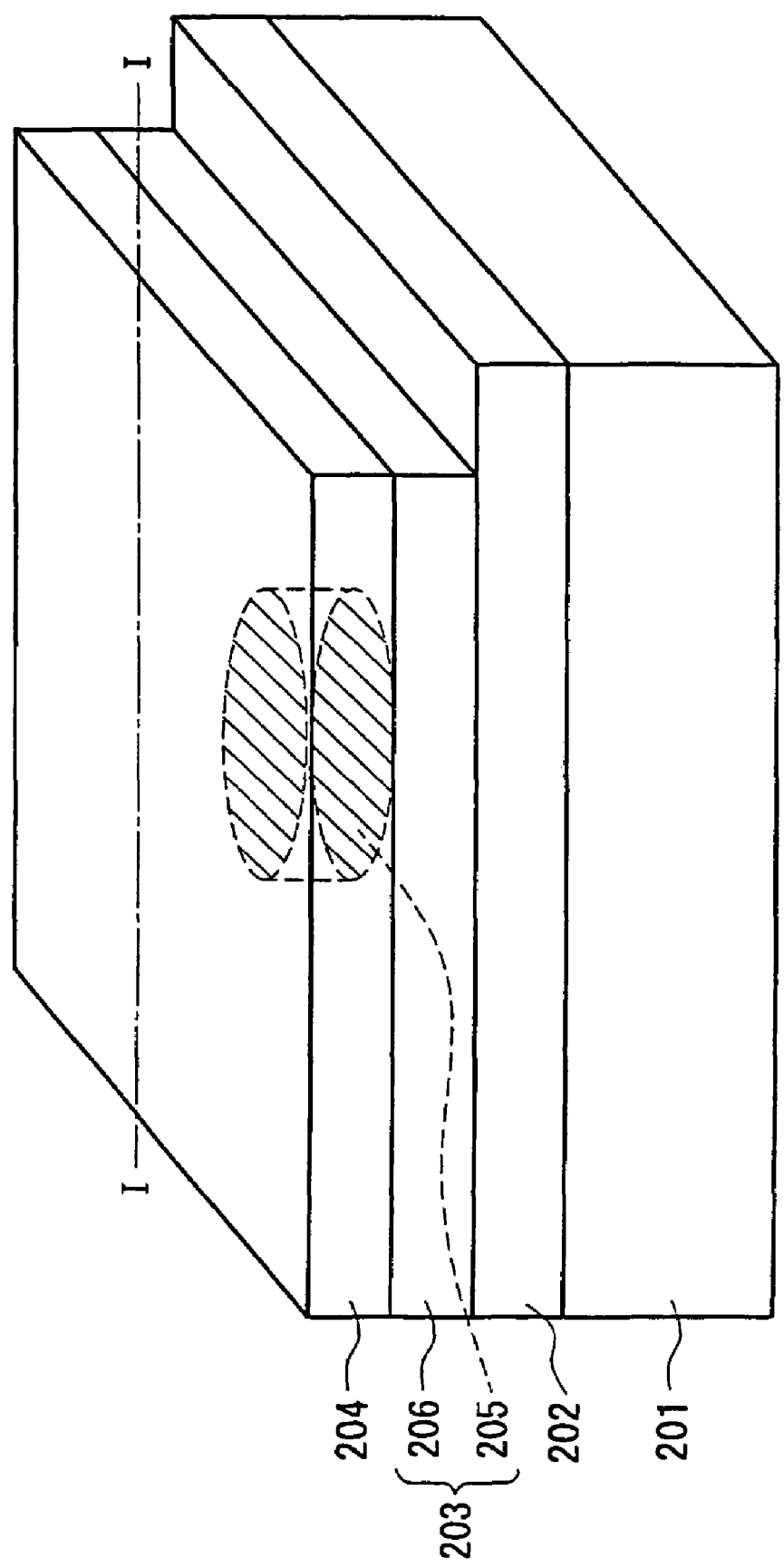
FIG. 3 is a perspective view showing an example of an information recording medium of the present invention on which information is recorded by application of electric energy.

As Embodiment 3 of the present invention, one example of an information recording medium on/from which information is recorded/reproduced by application of electric energy will be described. FIG. 3 shows a perspective view of the information recording medium of this embodiment.

As shown in FIG. 3, the information recording medium of this embodiment is a memory in which a lower electrode 202, a recording portion 203 and an upper electrode 204 are formed on a surface of a substrate 201 in this order. The recording portion 203 of the memory has a structure including a cylindrical recording layer 205 and a dielectric layer 206 enclosing the recording layer 205. Unlike the information recording medium described in Embodiments 1 and 2 with reference to FIGS. 1 and 2, in the memory of this embodiment, the recording layer 205 and the dielectric layer 206 are formed on the same plane and are not laminated. However, both the recording layer 205 and the dielectric layer 206 constitute a part of a laminate including the substrate 201, the lower and the upper electrode 202 and 204, and therefore they can be referred to as "layers". Thus, the information recording medium of the present invention includes the embodiment in which the recording layer and the dielectric layer are formed on the same plane.

More specifically, as the substrate 201, semiconductor substrates such as Si substrate, substrates made of polycarbonate or acrylic resin, and insulating substrates such as $SiO_2$ substrates and $Al_2O_3$ substrates can be used. The lower electrode 202 and the upper electrode 204 are formed of a suitable conductive material. The lower electrode 202 and the upper electrode 204 can be formed by, for example, sputtering a metal such as Au, Ag, Pt, Al, Ti, W and Cr and a mixture of these metals.

The recording layer 205 constituting the recording portion 203 is formed of a material that is phase-changed by applying electric energy and thus can be referred to as a phase change portion in the recording portion 203. The recording layer 205 is formed of a material that is phase-changed between the crystalline phase and the amorphous phase by Joule heat generated by applying electric energy. As the material of the recording layer 205, for example, Ge—Sb—Te, Ge—Sn—Sb—Te, Ge—Bi—Te, Ge—Sn—Bi—Te, Ge—Sb—Bi—Te, and Ge—Sn—Sb—Bi—Te based materials can be used. More specifically, for example, $GeTe—Sb_2Te_3$ or $GeTe—Bi_2Te_3$ based materials can be used.

The dielectric layer 206 constituting the recording portion 203 serves to prevent current flowing through the recording layer 205 from escaping to the periphery upon applying a voltage between the upper electrode 204 and the lower electrode 202 and to insulate the recording layer 205 electrically and thermally. Therefore, the dielectric layer 206 can be referred to as an "insulating portion". For the dielectric layer 206, the oxide-based material layer, the oxide-nitride-based material layer or the oxide-fluoride-based material layer, more specifically, a layer containing a material expressed by the composition formulae (1) or (2) can be used. These material layers can be used preferably for the dielectric layer 206 for the following reasons: the melting point is high; the atoms in the material layer are hardly diffused even if it is heated; and the thermal conductivity is low.

This embodiment will be described more specifically by way of examples below together with an operating method thereof.

EXAMPLES

Next, the present invention will be described more specifically.

First, the relationship between the nominal composition (in other words, the composition indicated nominally by a sputtering target manufacturer when being supplied) and the analyzed composition with respect to the sputtering target made of an oxide-based material, an oxide-nitride-based material and an oxide-fluoride-based material used when forming, for example, the dielectric layer of the information recording medium of the present invention was confirmed by a test in advance.

In this test, for example, the sputtering target expressed by $(SnO_2)_{30}(Ga_2O_3)_{40}(Si_3N_4)_{30}$ (mol %) corresponding to the composition formula (10) as the nominal composition was used. This sputtering target was made into powder, and the composition was analyzed by the X-ray microanalyzer method. As a result, the analyzed composition of the sputtering target was obtained as the composition formula indicated by the ratio of the elements (atom %). Table 1 shows the analyzed results. Furthermore, Table 1 also shows the converted composition that is an element composition obtained based on the nominal composition.

TABLE 1

| nominal composition (mol %) $(SnO_2)_{30}(Ga_2O_3)_{40}(Si_3N_4)_{30}$ converted composition (atom %) $Sn_6 Ga_{16} O_{36} Si_{18} N_{24}$ | composition analysis of target analyzed composition (atom %) $Sn_{5.4} Ga_{17.1} O_{36.8} Si_{18.2} N_{22.5}$ |
|---|---|

As shown in Table 1, the analyzed composition was substantially equal to the converted composition. These results confirmed that the actual composition (i.e., analyzed composition) of the sputtering target expressed by the composition formula (10) substantially matched the element composition (i.e., converted composition) obtained by calculations, and therefore that the nominal composition was proper. Therefore, in the following examples, the composition of a sputtering target is shown by the nominal composition (mol %). It also was confirmed that the nominal composition of a sputtering target can be regarded as being the same as the composition (mol %) of the oxide-based material layer, the oxide-nitride-based material, and the oxide-fluoride-based material layer formed by sputtering with this sputtering target. Therefore, in the following examples, the composition of a layer formed with a sputtering target is expressed by the composition of the sputtering target.

Example 1

In Example 1, the information recording medium described in Embodiment 1 and shown in FIG. 1 in which the first dielectric layer 2 and the second dielectric layer 6 were formed with a sputtering target whose nominal composition was $(SnO_2)_{95}(AlN)_5$ (mol %). The first dielectric layer 2 and the second dielectric layer 6 were formed of the same material. Hereinafter, a method for producing the information recording medium of this embodiment will be described. In the following description, the same reference numerals as those of the components shown in FIG. 1 are used.

First, a round polycarbonate substrate having a diameter of 120 mm and a thickness of 0.6 mm that previously was provided with guide grooves having a depth of 56 nm and a track pitch (distance between the centers of the groove face and the land face in a plane parallel to the main plane of the substrate 1) of 0.615 μm on one surface was prepared as a substrate 1.

A first dielectric layer 2 having a thickness of 150 nm, a recording layer 4 having a thickness of 8 nm, a second dielectric layer 6 having a thickness of 50 nm, a light-absorption correction layer 7 having a thickness of 40 nm, and a reflective layer 8 having a thickness of 80 nm were formed on the substrate 1 in this order by sputtering in the following method.

As the material constituting the first dielectric layer 2 and the second dielectric layer 6, $(SnO_2)_{95}(AlN)_5$ (mol %) was used.

In the step of forming the first dielectric layer 2 and the second dielectric layer 6, a sputtering target (diameter: 100 mm, thickness: 6 mm) made of the material as described above was provided in a film-formation apparatus, and sputtering was performed in an atmosphere of a mixed gas of Ar gas and oxygen gas (the partial pressure of oxygen gas: 3%) with a pressure of 0.13 Pa at a high frequency power of 400 W.

In the step of forming the recording layer 4, a sputtering target (diameter: 100 mm, thickness: 6 mm) made of the Ge—Sn—Sb—Te material in which a part of Ge of a GeTe—$Sb_2Te_3$ pseudo-binary composition is substituted with Sn was provided in a film-formation apparatus, and DC sputtering was performed in an atmosphere of a mixed gas of Ar gas and nitrogen gas (the partial pressure of nitrogen gas: 3%) with a pressure of 0.13 Pa at 100 W. The composition of the recording layer was $Ge_{27}Sn_8Sb_{12}Te_{53}$ (atom %).

In the step of forming the light-absorption correction layer 7, a sputtering target (diameter: 100 mm, thickness: 6 mm) made of a material having a composition of $Ge_{80}Cr_{20}$ (atom %) was provided in a film-formation apparatus, and DC sputtering was performed in an Ar gas atmosphere with a pressure of about 0.4 Pa at a power of 300 W.

In the step of forming the reflective layer 8, a sputtering target (diameter: 100 mm, thickness: 6 mm) made of a Ag—Pd—Cu alloy was provided in a film-formation apparatus, and DC sputtering was performed in an Ar gas atmosphere with a pressure of about 0.4 Pa at a power of 200 W.

After the reflective layer 8 was formed, UV curable resin was applied onto the reflective layer 8. An attachment substrate 10 made of polycarbonate having a diameter of 120 mm and a thickness of 0.6 mm was attached tightly onto the applied UV curable resin. Then, irradiation of ultraviolet rays was performed from the side of the attachment substrate 10 to cure the resin, so that the attachment substrate 10 was attached onto the reflective layer 8.

After the attachment substrate 10 was attached to the reflective layer 8, the initialization step was performed using a semiconductor laser having a wavelength of 810 nm to crystallize the recording layer 4. The production of the information recording medium was completed with the end of the initialization.

Example 2

An information recording medium of Example 2 was produced in the same manner as the information recording medium of Example 1, except that the first dielectric layer 2 and the second dielectric layer 6 were formed with a sputtering target whose nominal composition was $(Ga_2O_3)_{80}(Si_3N_4)_{20}$ (mol %).

Example 3

An information recording medium of Example 3 was produced in the same manner as the information recording medium of Example 1, except that the first dielectric layer 2 and the second dielectric layer 6 were formed with a sputtering target whose nominal composition was $(SnO_2)_{50}(Si_3N_4)_{50}$ (mol %).

Example 4

An information recording medium of Example 4 was produced in the same manner as the information recording medium of Example 1, except that the first dielectric layer 2 and the second dielectric layer 6 were formed with a sputtering target whose nominal composition was $(SnO_2)_{30}(Ga_2O_3)_{40}(Si_3N_4)_{30}$ (mol %).

Example 5

An information recording medium of Example 5 was produced in the same manner as the information recording medium of Example 1, except that the first dielectric layer 2 and the second dielectric layer 6 were formed with a sputtering target whose nominal composition was $(SnO_2)_{40}(Ga_2O_3)_{40}(SiO_2)_{20}$ (mol %).

Example 6

An information recording medium of Example 6 was produced in the same manner as the information recording medium of Example 1, except that the first dielectric layer 2 and the second dielectric layer 6 were formed with a sputtering target whose nominal composition was $(SnO_2)_{30}(Ga_2O_3)_{30}(SiO_2)_{20}(Si_3N_4)_{20}$ (mol %).

Example 7

An information recording medium of Example 7 was produced in the same manner as the information recording medium of Example 1, except that the first dielectric layer 2 and the second dielectric layer 6 were formed with a sputtering target whose nominal composition was $(ZnO)_{40}(Ga_2O_3)_{40}(SiO_2)_{10}(Si_3N_4)_{10}$ (mol %).

Example 8

An information recording medium of Example 8 was produced in the same manner as the information recording medium of Example 1, except that the first dielectric layer 2 and the second dielectric layer 6 were formed with a sputtering target whose nominal composition was $(ZnO)_{20}(SnO_2)_{60}(BN)_{20}$ (mol %).

Example 9

An information recording medium of Example 9 was produced in the same manner as the information recording medium of Example 1, except that the first dielectric layer 2 and the second dielectric layer 6 were formed with a sputtering target whose nominal composition was $(ZnO)_{30}(SnO_2)_{30}(AlN)_{20}(SiO_2)_{20}$ (mol %).

Example 10

An information recording medium of Example 10 was produced in the same manner as the information recording medium of Example 1, except that the first dielectric layer 2 and the second dielectric layer 6 were formed with a sputtering target whose nominal composition was $(ZnO)_{20}(SnO_2)_{20}(Ga_2O_3)_{40}(AlN)_{20}$ (mol %).

Example 11

An information recording medium of Example 11 was produced in the same manner as the information recording medium of Example 1, except that the first dielectric layer 2 and the second dielectric layer 6 were formed with a sputtering target whose nominal composition was $(SnO_2)_{70}(Al_2O_3)_{30}$ (mol %).

Example 12

An information recording medium of Example 12 was produced in the same manner as the information recording medium of Example 1, except that the first dielectric layer 2 and the second dielectric layer 6 were formed with a sputtering target whose nominal composition was $(SnO_2)_{70}(AlN)_{30}$ (mol %).

Example 13

An information recording medium of Example 13 was produced in the same manner as the information recording medium of Example 1, except that the first dielectric layer 2 and the second dielectric layer 6 were formed with a sputtering target whose nominal composition was $(SnO_2)_{60}(Ga_2O_3)_{20}(Al_2O_3)_{20}$ (mol %).

Example 14

An information recording medium of Example 14 was produced in the same manner as the information recording medium of Example 1, except that the first dielectric layer 2 and the second dielectric layer 6 were formed with a sputtering target whose nominal composition was $(SnO_2)_{40}(Ga_2O_3)_{40}(AlN)_{20}$ (mol %).

Example 15

An information recording medium of Example 15 was produced in the same manner as the information recording medium of Example 1, except that the first dielectric layer 2 and the second dielectric layer 6 were formed with a sputtering target whose nominal composition was $(SnO_2)_{70}(LaF_3)_{30}$ (mol %).

Example 16

An information recording medium of Example 16 was produced in the same manner as the information recording medium of Example 1, except that the first dielectric layer 2 and the second dielectric layer 6 were formed with a sputtering target whose nominal composition was $(ZnO)_{50}(CeF_3)_{50}$ (mol %).

Example 17

An information recording medium of Example 17 was produced in the same manner as the information recording medium of Example 1, except that the first dielectric layer 2 and the second dielectric layer 6 were formed with a sputtering target whose nominal composition was $(SnO_2)_{30}(Ga_2O_3)_{40}(LaF_3)_{30}$ (mol %).

Comparative Example 1

As an information recording medium of Comparative Example 1, an information recording medium having the structure shown in FIG. 6 was produced. In this medium, the first dielectric layer 102 and the second dielectric layer 106 were formed with a sputtering target of $(ZnS)_{80}(SiO_2)_{20}$ (mol %). The first interface layer 103 and the second interface layer 105 were layers made of $ZrO_2$—$SiO_2$—$Cr_2O_3$ and having a thickness of 5 nm.

The first dielectric layer 102 and the second dielectric layer 106 were formed by high frequency sputtering with a sputtering target (diameter: 100 mm, thickness: 6 mm) made of $(ZnS)_{80}(SiO_2)_{20}$ (mol %) at a pressure of 0.13 Pa.

The first interface layer 103 and the second interface layer 105 were formed by providing a sputtering target (diameter: 100 mm, thickness: 6 mm) made of a material having a composition of $(ZrO_2)_{25}(SiO_2)_{25}(CrO_2)_{50}$ (mol %) and performing high frequency sputtering. Other than that, the light-absorption correction layer 7, the reflective layer 8 and the attachment substrate 10 were attached in the same manner as in the case of the information recording medium of Example 1.

Comparative Example 2

An information recording medium of Comparative Example 2 was produced in the same manner as the information recording medium of Example 1, except that the first dielectric layer 2 and the second dielectric layer 6 were formed with a sputtering target whose nominal composition was $SnO_2$.

Comparative Example 3

An information recording medium of Comparative Example 3 was produced in the same manner as the information recording medium of Example 1, except that the first dielectric layer 2 and the second dielectric layer 6 were formed with a sputtering target whose nominal composition was $Ga_2O_3$.

Comparative Example 4

An information recording medium of Comparative Example 4 was produced in the same manner as the information recording medium of Example 1, except that the first dielectric layer 2 and the second dielectric layer 6 were formed with a sputtering target whose nominal composition was ZnO.

Comparative Example 5

An information recording medium of Comparative Example 5 was produced in the same manner as the information recording medium of Example 1, except that the first dielectric layer 2 and the second dielectric layer 6 were formed with a sputtering target whose nominal composition was $(SnO_2)_{50}(Ga_2O_3)_{50}$ (mol %).

Next, the information recording media of Examples 1 to 17 and Comparative Examples 1 to 5 were evaluated. The evaluation method will be described below. The evaluation items were the following three: (1) adhesion between the dielectric layer and the recording layer; (2) recording density; and (3) rewriting performance.

First, adhesion (1) was evaluated based on the presence or the absence of the peeling under high temperature and high humidity conductions. More specifically, the information recording medium after the initialization step was left in a high temperature and high humidity bath at a temperature of 90° C. and a relative humidity of 80% for 100 hours, and then it was examined visually with an optical microscope whether or not peeling occurred at at least one of the interfaces between the recording layer 4 and the first dielectric layer 2 and the second dielectric layer 6 that were in contact with the recording layer.

Recording sensitivity (2) and repeated rewriting performance (3) were evaluated based on the optimal power and the number of repetitions at that recording power.

In order to evaluate signals of the information recording media, an information recording system having a general structure including a spindle motor for rotating the information recording medium, an optical head provided with a semiconductor laser emitting laser light, and an object lens for focusing the laser light on the recording layer 4 of the information recording medium was used. More specifically, recording corresponding to a capacity of 4.7 GB was performed using a semiconductor laser with a wavelength of 660 nm and an objective lens having a numerical aperture of 0.6. The linear velocity at which the information recording medium was rotated was 8.2 m/sec. A time interval analyzer was used to measure the jitter value to obtain the average jitter value as described below.

First, a peak power (Pp) and a bias power (Pb) were set in the following procedure in order to determine the measurement conditions for determining the number of repetitions. Using the above-describe system, the information recording medium was irradiated with the laser light while changing the power between a peak power (mW) in a high power level and a bias power (mW) in a low power level, and a random signal having a mark length of 0.42 μm (3T) to 1.96 μm (14T) was recorded (by groove recording) ten times on the same groove face of the recording layer 4. Then, the jitter value between the front ends (jitter in the front end portion of a recording mark) and the jitter value between the rear ends (jitter in the rear end portion of a recording mark) were measured and then the average jitter value was obtained as the average of these jitter values. The bias power was fixed to a predetermined value, and the average jitter value was measured with respect to each recording condition in which the peak power was changed variously. The peak power was gradually increased, and when the average jitter value of the random signal reached 13%, a power 1.3 times larger than the peak power was taken as Pp1 for example. Then, the peak power was fixed to Pp1 and the average jitter value was measured with respect to each recording condition in which the bias power was changed variously. The average of the upper limit and the lower limit of the bias power when the average jitter value of the random signal became 13% or less was set to Pb. Then, the bias power was fixed to Pb, and the average jitter value was measured with respect to each recording condition in which the peak power was changed variously. The peak power was gradually increased, and when the average jitter value of the random signal reached 13%, a power 1.3 times larger than the power was set to Pp. When recording was performed under the conditions of the thus set Pp and Pb, for example, an average jitter value of 8 to 9% was obtained when recording was repeated 10 times. In view of the upper limit of the laser power of the system, it is preferable to satisfy $P_p \leq 14$ mW and $Pb \leq 8$ mW.

The number of repetitions was determined based on the average jitter value in this example. The information recording medium was irradiated with the laser light while changing the power between Pp and Pb set as above, and a random signal having a mark length of 0.42 μm (3T) to 1.96 μm (14T) was recorded (by groove recording) repeatedly and continuously in the predetermined number of times on the same groove face. Then, the average jitter value was measured. The average jitter value was measured when the number of repetitions is 1, 2, 3, 5, 10, 100, 200 and 500. When the number of repetitions was 1000 or more, measurement was performed every 1000 times up to 10000 times. The repeated rewriting performance was evaluated by the number of repetitions at the time when the average jitter value reached 13%. The larger number of repetitions means the higher repeated rewriting performance. When the information recording medium is used in a video/audio recorder, it is preferable that the number of repetitions is 10000 or more.

TABLE 2

|  | nominal composition (mol %) | converted composition (atom %) | peeling | Pp (mW) | rewriting performance |
|---|---|---|---|---|---|
| Ex. 1 | $(SnO_2)_{95}(AlN)_5$ | $Sn_{32.2}O_{64.4}Al_{1.7}N_{1.7}$ | no | 13.8 | A |
| Ex. 2 | $(Ga_2O_3)_{80}(Si_3N_4)_{20}$ | $Ga_{29.6}O_{44.4}Si_{11.1}N_{14.8}$ | no | 12.7 | A |
| Ex. 3 | $(SnO_2)_{50}(Si_3N_4)_{50}$ | $Sn_{10}O_{20}Si_{30}N_{40}$ | no | 10.5 | A |
| Ex. 4 | $(SnO_2)_{30}(Ga_2O_3)_{40}(Si_3N_4)_{30}$ | $Sn_6Ga_{16}O_{36}Si_{18}N_{24}$ | no | 12.7 | A |
| Ex. 5 | $(SnO_2)_{40}(Ga_2O_3)_{40}(SiO_2)_{20}$ | $Sn_{10.5}Ga_{21.1}O_{63.2}Si_{5.3}$ | no | 13.0 | A |
| Ex. 6 | $(SnO_2)_{30}(Ga_2O_3)_{30}(SiO_2)_{20}(Si_3N_4)_{20}$ | $Sn_{6.8}Ga_{13.6}O_{43.2}Si_{18.2}N_{18.2}$ | no | 12.2 | A |
| Ex. 7 | $(ZnO)_{40}(Ga_2O_3)_{40}(SiO_2)_{10}(Si_3N_4)_{10}$ | $Zn_{10.5}Ga_{21.1}O_{47.43}Si_{10.5}N_{10.5}$ | no | 13.7 | A |
| Ex. 8 | $(ZnO)_{20}(SnO_2)_{60}(BN)_{20}$ | $Zn_{7.7}Sn_{23.1}O_{53.8}B_{7.7}N_{7.7}$ | no | 13.8 | A |
| Ex. 9 | $(ZnO)_{30}(SnO_2)_{30}(AlN)_{20}(SiO_2)_{20}$ | $Zn_{12}Sn_{12}O_{52}Si_8Al_8N_8$ | no | 13.5 | A |
| Ex. 10 | $(ZnO)_{20}(SnO_2)_{20}(Ga_2O_3)_{40}(AlN)_{20}$ | $Zn_{5.9}Sn_{5.9}Ga_{23.5}O_{52.9}Al_{5.9}N_{5.9}$ | no | 13.7 | A |
| Ex. 11 | $(SnO_2)_{70}(Al_2O_3)_{30}$ | $Sn_{19.4}O_{63.9}Al_{16.7}$ | no | 13.6 | A |
| Ex. 12 | $(SnO_2)_{70}(AlN)_{30}$ | $Sn_{25.9}O_{51.9}Al_{11.1}N_{11.1}$ | no | 13.2 | A |
| Ex. 13 | $(SnO_2)_{60}(Ga_2O_3)_{20}(Al_2O_3)_{20}$ | $Sn_{15.8}Ga_{10.5}O_{63.2}Al_{10.5}$ | no | 13.7 | A |
| Ex. 14 | $(SnO_2)_{40}(Ga_2O_3)_{40}(AlN)_{20}$ | $Sn_{11.1}Ga_{22.2}O_{55.6}Al_{5.6}N_{5.6}$ | no | 13.0 | A |
| Ex. 15 | $(SnO_2)_{70}(LaF_3)_{30}$ | $Sn_{21.2}O_{42.4}La_{9.1}F_{27.3}$ | no | 12.9 | A |
| Ex. 16 | $(ZnO)_{50}(CeF_3)_{50}$ | $Zn_{16.7}O_{16.7}Ce_{16.7}F_{50}$ | no | 13.3 | A |
| Ex. 17 | $(SnO_2)_{40}(Ga_2O_3)_{40}(LaF_3)_{20}$ | $Sn_{10}Ga_{20}O_{50}La_5F_{15}$ | no | 13.1 | A |
| Com. Ex. 1 | (conventional example seven layers) | — | no | 12.0 | A |
| Com. Ex. 2 | $SnO_2$ | $Sn_{33.3}O_{66.7}$ | no | 14.5 | B |
| Com. Ex. 3 | $Ga_2O_3$ | $Ga_{40}O_{60}$ | no | 14.9 | A |

TABLE 2-continued

| | nominal composition (mol %) | converted composition (atom %) | peeling | Pp (mW) | rewriting performance |
|---|---|---|---|---|---|
| Com. Ex. 4 | ZnO | $Zn_{50}O_{50}$ | no | 15.2 | C |
| Com. Ex. 5 | $(SnO_2)_{50}(Ga_2O_3)_{50}$ | $Sn_{12.5}Ga_{25}O_{62.5}$ | no | 14.7 | B |

Table 2 shows the evaluation results of (1) adhesion, (2) recording sensitivity and (3) rewriting performance in the information recording media of Examples 1 to 17 and Comparative Examples 1 to 5. Table 2 also shows the atom % of the materials used for the dielectric layers of Examples 1 to 17 and Comparative Examples 2 to 5. Herein, as the evaluation results of the adhesion, the presence or the absence of the peeling after high temperature and high humidity tests are shown. For the recording sensitivity, the set peak power is shown, and the recording sensitivity was evaluated to be good when it was 14 mW or less. For the rewriting performance, those having a number of repetitions of less than 1000 times is shown by C, those having a number of repetitions of 1000 or more and 10000 or less times is shown by B, and those having a number of repetitions of 10000 or more times is shown by A.

As seen from Table 2, first, when the material of the dielectric layers 2 and 6 were $SnO_2$, $Ga_2O_3$, and ZnO, the adhesion between the recording layer 4 and the dielectric layers 2 and 6 was good, whereas the recording sensitivity was insufficient (Comparative Examples 2 to 5). On the other hand, good recording sensitivity was obtained by mixing $SiO_2$, AlN, BN, $Si_3N_4$, $LaF_3$, and $CeF_3$ with the oxide group consisting of $SnO_2$, $Ga_2O_3$, and ZnO in the range defined in the present invention as in Examples 1 to 17.

In view of the balance between the recording sensitivity and the rewriting performance, it is preferable that the ratio of the oxide group of $SnO_2$, $Ga_2O_3$, and ZnO is 50 mol % or more, and it is preferable that the ratio of $SiO_2$, AlN, BN, $Si_3N_4$, $LaF_3$, and $CeF_3$ is at least 5 mol % in view of the recording sensitivity.

Next, examples of information recording media having the structure of Embodiment 2 will be described below.

Example 18

The information recording medium of this example is an information recording medium described in Embodiment 2 and shown in FIG. 2 in which the first dielectric layer 102 was formed with $(ZnS)_{80}(SiO_2)_{20}$ (mol %), and the interface layer 103 was formed to a thickness of 2 to 5 nm, using $ZrO_2$—$SiO_2$—$Cr_2O_3$. The structure other than above was produced in the same manner as in the case of the information recording medium of Example 1. In Example 18, the second dielectric layer 6 provided in contact with the recording layer 4 was formed with a sputtering target of a material used in Example 1.

Example 19

An information recording medium of Example 19 was produced in the same manner as the information recording medium of Example 18, except that the second dielectric layer 6 was formed with the sputtering target used in Example 2.

Example 20

An information recording medium of Example 20 was produced in the same manner as the information recording medium of Example 18, except that the second dielectric layer 6 was formed with the sputtering target used in Example 3.

Example 21

An information recording medium of Example 21 was produced in the same manner as the information recording medium of Example 18, except that the second dielectric layer 6 was formed with the sputtering target used in Example 4.

Example 22

An information recording medium of Example 22 was produced in the same manner as the information recording medium of Example 18, except that the second dielectric layer 6 was formed with the sputtering target used in Example 5.

Example 23

An information recording medium of Example 23 was produced in the same manner as the information recording medium of Example 18, except that the second dielectric layer 6 was formed with the sputtering target used in Example 7.

Example 24

An information recording medium of Example 24 was produced in the same manner as the information recording medium of Example 18, except that the second dielectric layer 6 was formed with the sputtering target used in Example 9.

Example 25

An information recording medium of Example 25 was produced in the same manner as the information recording medium of Example 18, except that the second dielectric layer 6 was formed with the sputtering target used in Example 10.

Example 26

An information recording medium of Example 26 was produced in the same manner as the information recording medium of Example 18, except that the second dielectric layer 6 was formed with the sputtering target used in Example 11.

Example 27

An information recording medium of Example 27 was produced in the same manner as the information recording medium of Example 18, except that the second dielectric layer 6 was formed with the sputtering target used in Example 12.

Example 28

An information recording medium of Example 28 was produced in the same manner as the information recording medium of Example 18, except that the second dielectric layer 6 was formed with the sputtering target used in Example 13.

Example 29

An information recording medium of Example 29 was produced in the same manner as the information recording medium of Example 18, except that the second dielectric layer 6 was formed with the sputtering target used in Example 14.

Comparative Example 6

An information recording medium of Comparative Example 6 was produced in the same manner as the information recording medium of Example 18, except that the second dielectric layer 6 was formed with the sputtering target used in Comparative Example 2.

Comparative Example 7

An information recording medium of Comparative Example 7 was produced in the same manner as the information recording medium of Example 18, except that the second dielectric layer 6 was formed with the sputtering target used in Comparative Example 3.

Comparative Example 8

An information recording medium of Comparative Example 8 was produced in the same manner as the information recording medium of Example 18, except that the second dielectric layer 6 was formed with the sputtering target used in Comparative Example 5.

Table 3 shows the evaluation results of (1) adhesion, (2) recording sensitivity and (3) rewriting performance in the information recording media of Examples 18 to 29 and Comparative Examples 6 to 8. The criteria based on which the evaluation is performed are the same as those shown in Table 2.

As seen from Table 3, when the first dielectric layer 102 and the interface layer 103 were provided between the substrate 1 and the recording layer 4 and the material of the present invention is used only for the second dielectric layer 6, substantially the same tendency as in Table 2 was seen.

In other words, for the oxide group consisting $SnO_2$, $Ga_2O_3$, and ZnO, the adhesion between the recording layer 4 and the dielectric layer 6 was good whereas the recording sensitivity was insufficient (Comparative Examples 6 to 8). On the other hand, good recording sensitivity was obtained by mixing $SiO_2$, AN, BN, $Si_3N_4$, $LaF_3$, and $CeF_3$ with the oxide group consisting of $SnO_2$, $Ga_2O_3$, and ZnO in the range defined in the present invention as in Examples 18 to 29.

In view of the balance between the recording sensitivity and the rewriting performance, it is preferable that the ratio of the oxide group of $SnO_2$, $Ga_2O_3$, and ZnO is 50 mol % or more, and it is preferable that the ratio of $SiO_2$, AlN, BN, $Si_3N_4$, $LaF_3$, and $CeF_3$ is at least 5 mol % in view of the recording sensitivity.

As in the information recording media of Examples 1 to 29, when the oxide-based material layer, the oxide-based material layer and the oxide-fluoride-based material layer as described above is used for the dielectric layer that is formed in contact with the recording layer, the object of reducing the number of layers can be achieved, and good rewriting performance can be obtained. The present invention is not limited to these examples. In the information recording medium of the present invention, it is sufficient that at least one of the layers is formed of the oxide-based material layer, the oxide-nitride-based material layer or the oxide-fluoride-based material layer as described above.

Example 30

In Examples 1 to 29, information recording media on which information was to be recorded by optical means were produced. In Example 30, an information recording medium on which information was to be recorded by electric means was produced, as shown in FIG. 3. This is a so-called memory.

TABLE 3

| | nominal composition (mol %) | converted composition (atom %) | peeling | Pp (mW) | rewriting performance |
|---|---|---|---|---|---|
| Ex. 18 | $(SnO_2)_{95}(AlN)_5$ | $Sn_{32.2}O_{64.4}Al_{1.7}N_{1.7}$ | no | 13.7 | A |
| Ex. 19 | $(Ga_2O_3)_{80}(Si_3N_4)_{20}$ | $Ga_{29.6}O_{44.4}Si_{11.1}N_{14.8}$ | no | 12.7 | A |
| Ex. 20 | $(SnO_2)_{50}(Si_3N_4)_{50}$ | $Sn_{10}O_{20}Si_{30}N_{40}$ | no | 10.4 | A |
| Ex. 21 | $(SnO_2)_{30}(Ga_2O_3)_{40}(Si_3N_4)_{30}$ | $Sn_6Ga_{16}O_{36}Si_{18}N_{24}$ | no | 12.5 | A |
| Ex. 22 | $(SnO_2)_{40}(Ga_2O_3)_{40}(SiO_2)_{20}$ | $Sn_{10.5}Ga_{21.1}O_{63.2}Si_{5.3}$ | no | 13.0 | A |
| Ex. 23 | $(ZnO)_{40}(Ga_2O_3)_{40}(SiO_2)_{10}(Si_3N_4)_{10}$ | $Zn_{10.5}Ga_{21.1}O_{47.4}Si_{10.5}N_{10.5}$ | no | 13.6 | A |
| Ex. 24 | $(ZnO)_{30}(SnO_2)_{30}(AlN)_{20}(SiO_2)_{20}$ | $Zn_{12}Sn_{12}O_{52}Si_8Al_8N_8$ | no | 13.3 | A |
| Ex. 25 | $(SnO_2)_{70}(LaF_3)_{30}$ | $Sn_{21.2}O_{42.4}La_{9.1}F_{27.3}$ | no | 13.4 | A |
| Ex. 26 | $(SnO_2)_{70}(Al_2O_3)_{30}$ | $Sn_{19.4}O_{63.9}Al_{16.7}$ | no | 13.1 | A |
| Ex. 27 | $(SnO_2)_{70}(AlN)_{30}$ | $Sn_{25.9}O_{51.9}Al_{11.1}N_{11.1}$ | no | 12.6 | A |
| Ex. 28 | $(SnO_2)_{60}(Ga_2O_3)_{20}(Al_2O_3)_{20}$ | $Sn_{15.8}Ga_{10.5}O_{63.2}Al_{10.5}$ | no | 13.3 | A |
| Ex. 29 | $(SnO_2)_{40}(Ga_2O_3)_{40}(AlN)_{20}$ | $Sn_{11.1}Ga_{22.2}O_{55.6}Al_{5.6}N_{5.6}$ | no | 12.6 | A |
| Com. Ex. 6 | $SnO_2$ | $Sn_{33.3}O_{66.7}$ | no | 14.3 | B |
| Com. Ex. 7 | $Ga_2O_3$ | $Ga_{40}O_{60}$ | no | 14.9 | A |
| Com. Ex. 8 | $(SnO_2)_{50}(Ga_2O_3)_{50}$ | $Sn_{12.5}Ga_{25}O_{62.5}$ | no | 14.1 | B |

The information recording medium of this example was produced in the following manner. First, a Si substrate 201 having a length of 5 mm, a width of 5 mm and a thickness of 1 mm whose surface had been subjected to nitriding was prepared. A lower electrode 202 of Au was formed to a thickness of 0.1 μm in an area of 1.0 mm×1.0 mm on this substrate 201. A recording layer 205 that serves as a phase change portion (hereinafter, referred to as a "phase change portion 205") was formed of a material of $Ge_{38}Sb_{10}Te_{52}$ (expressed by $Ge_8Sb_2Te_{11}$ as a compound) to a thickness of 0.1 μm in a circular area with a diameter of 0.2 mm on the lower electrode 202. A dielectric layer 206 that serves as insulating portion 206 (insulating portion 206) was formed, using a material of $(ZnO)_{40}(Ga_2O_3)_{40}(SiO_2)_{10}(Si_3N_4)_{10}$ (mol %) to the same thickness as the phase change portion 205 in an area of 0.6 mm×0.6 mm (excluding the phase change portion 205). Furthermore, an upper electrode 204 of Au was formed to a thickness of 0.1 μm in an area of 0.6 mm×0.6 mm. The lower electrode 202, the phase change portion 205, the insulating portion 206 and the upper electrode 204 were formed by sputtering.

In the step of forming the phase change portion 205, a sputtering target (diameter: 100 mm, thickness: 6 mm) made of a Ge—Sb—Te material was provided in a film-formation apparatus, and DC sputtering was performed at a power of 100 W with Ar gas introduced. The pressure during the sputtering was about 0.13 Pa. In the step of forming the insulating portion 206, a sputtering target (diameter: 100 mm, thickness: 6 mm) made of a material having a composition of $(ZnO)_{40}(Ga_2O_3)_{40}(SiO_2)_{10}(Si_3N_4)_{10}$ (mol %) was provided in a film-formation apparatus, and high frequency sputtering was performed at a pressure of about 0.13 Pa. The power was 400 W. During the sputtering, Ar gas was introduced. The sputtering in these processes was performed while the areas other than the surface on which a film was to be formed were covered with a masking tool so that the phase change portion 205 and the insulating portion 206 were not laminated on each other. The order of forming the phase change portion 205 and the insulating portion 206 does not matter, and either can be formed first. The phase change portion 205 and the insulating portion 206 constitute the recording portion 203. The phase change portion 205 corresponds to the recording layer in the present invention, and the insulating portion 206 corresponds to the oxide-based material layer in the present invention.

The lower electrode 202 and the upper electrode 204 can be formed by sputtering that is generally used in the field of electrode forming, so that the process of forming these films is not described in detail.

Figure 4:
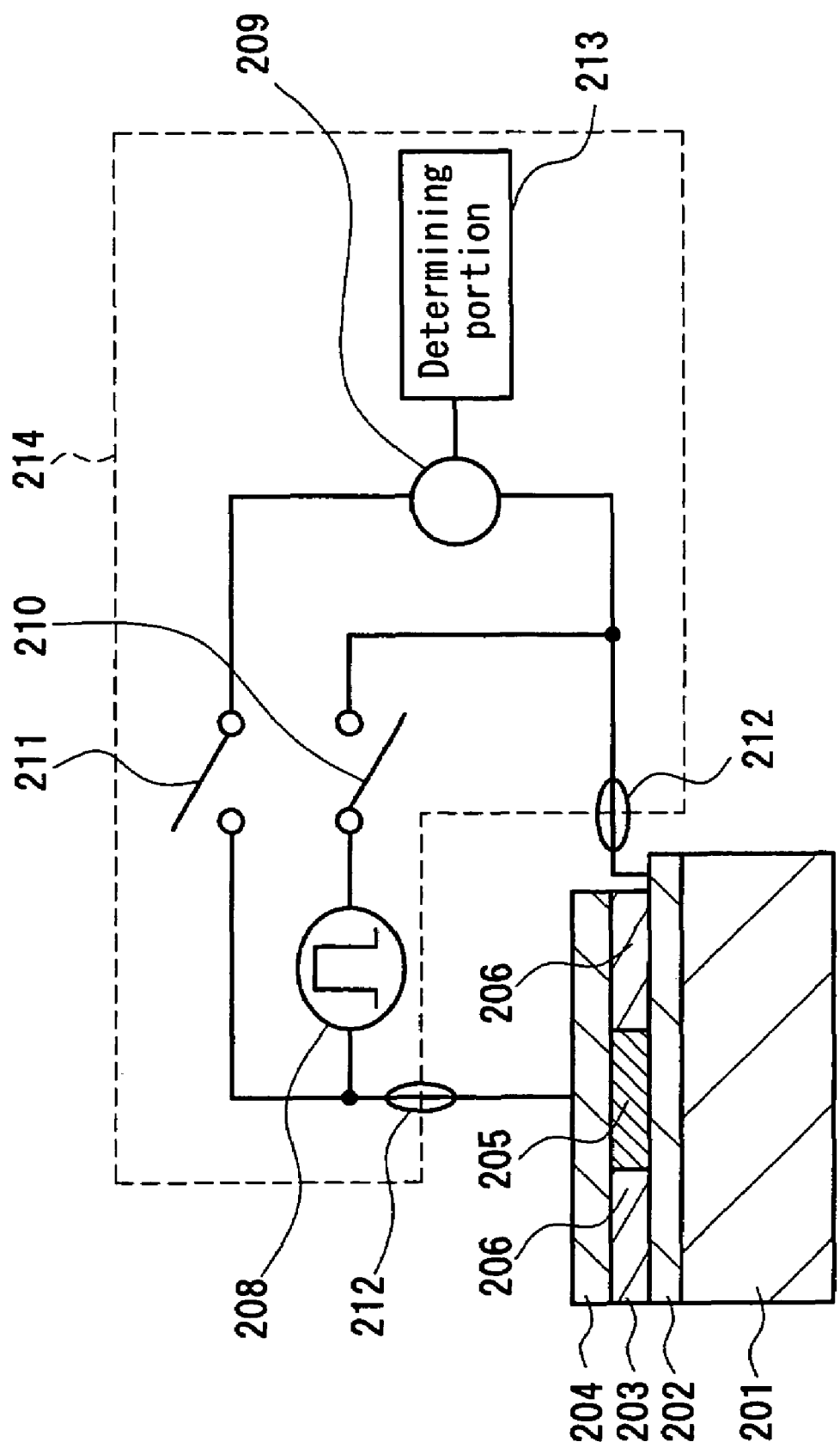
FIG. 4 is a schematic view showing an example of a system using the information recording medium shown in FIG. 3.

It was confirmed by a system shown in FIG. 4 that a phase change is caused in the phase change portion 205 by applying electric energy to the information recording medium produced in the above-described manner. The cross-sectional view of the information recording medium shown in FIG. 4 shows the cross-section taken in the thickness direction along line I—I of the information recording medium shown in FIG. 3.

More specifically, as shown in FIG. 4, by bonding two applying portions 212 to the lower electrode 202 and the upper electrode 204, respectively, with Au lead wires, an electric write/read-out device 214 is connected to the information recording medium (memory) via the applying portions 212. In this electric write/read-out device 214, a pulse generating portion 208 is connected between the applying portions 212 each connected to the lower electrode 202 and the upper electrode 204 via a switch 210, and a resistance measuring device 209 is connected therebetween via a switch 211. The resistance measuring device 209 is connected to a determining portion 213 that determines whether a resistance value measured by the resistance measuring device 209 is high or low. A current pulse is allowed to flow between the upper electrode 204 and the lower electrode 202 via the applying portion 212 by the pulse generating portion 208, and the resistance value between the lower electrode 202 and the upper electrode 204 is measured by the resistance measuring device 209. Then, the determining portion 213 determines whether this resistance value is high or low. In general, since the resistance value is changed by a phase change of the phase change portion 205, the phase state of the phase change portion 205 can be known based on the determination results.

In the case of Example 30, the melting point of the phase change portion 205 was 630° C., the crystallization temperature was 170° C., and the crystallization time was 130 ns. The resistance value between the lower electrode 202 and the upper electrode 204 was 1000 Ω when the phase change portion 205 was in the amorphous phase state and was 20 Ω when the phase change portion 205 was in the crystalline phase state. When the phase change portion 205 was in the amorphous phase state (i.e., the state of high resistance) and a current pulse of 20 mA and 150 ns was applied between the lower electrode 202 and the upper electrode 204, the resistance value between the lower electrode 202 and the upper electrode 204 was reduced, and the phase change portion 205 was changed from the amorphous phase state to the crystalline phase state. Next, when the phase change portion 205 was in the crystalline phase state (i.e., the state of low resistance) and a current pulse of 200 mA and 100 ns was applied between the lower electrode 202 and the upper electrode 204, the resistance value between the lower electrode 202 and the upper electrode 204 was increased, and the phase change portion 205 was changed from the crystalline phase state to the amorphous phase state.

The results obtained above confirmed that a phase change is caused in the phase change portion 205 by applying electric energy when a layer containing a material having a composition of $(ZnO)_4O(Ga_2O_3)_4O(SiO_2)_{10}(Si_3N_4)_{10}$ (mol %) is formed as the insulating portion 206 surrounding the phase change portion 205, and thus the function of recording information can be provided. Judging from the recording sensitivity of Examples 1 to 29, it is believed that the same effect can be obtained with the oxide-based material layer or oxide-fluoride-based material layer that are used in Examples 1 to 29.

As in Example 30, when the insulating portion 206 of $(ZnO)_{40}(Ga_2O_3)_{40}(SiO_2)_{10}(Si_3N_4)_{10}$ (mol %) that is a dielectric is provided around the cylindrical phase change portion 205, current flowing through the phase change portion 205 by applying a voltage between the upper electrode 204 and the lower electrode 202 is prevented effectively from escaping to the surrounding portion. As a result, the temperature of the phase change portion 205 can be increased efficiently by the Joule heat generated by the current. In particular, to change the phase change portion 205 to the amorphous phase state, it is necessary to melt $Ge_{38}Sb_{10}Te_{52}$ of the phase change portion 205 and then cool it rapidly. The phase change portion 205 can be melted with a smaller current by providing the insulating portion 206 around the phase change portion 205.

$(ZnO)_{40}(Ga_2O_3)_{40}(SiO_2)_{10}(Si_3N_4)_{10}$ (mol %) used for the insulating portion 206 has a high melting point, and atomic diffusion due to heat hardly occurs, and therefore this can be applied to an electric memory as described above. Furthermore, when the insulating portion 206 is present around the phase change portion 205, the insulating portion 206 serves as a barrier so that the phase change portion 205 is substantially isolated electrically and thermally in the plane of the recording portion 203. Utilizing this, it is possible to increase the memory capacity of the information recording medium and to improve the access function and the switching function by providing a plurality of phase change portions 205 that are isolated each other by the insulating portion 206. Moreover, a plurality of information recording media can be coupled.

As described with respect to the information recording media of the present invention through the various examples, the structure that has not been achieved can be achieved and better performance than that of the conventional information recording medium can be provided by providing the oxide-based material layer, the oxide-nitride-based material layer or the oxide-fluoride-based material layer that are defined in the present invention so as to be in contact with the recording layer (using these layers for the dielectric layer or the insulating portion) for both the information recording medium for recording with optical means and the information recording medium for recording with electric means.

As described above, the information recording medium of the present invention and the method for producing the same can provide an information recording medium with a reduced number of constituent layers that has excellent recording sensitivity and rewriting characteristics and high reliability in a method that can provide high productivity. Furthermore, the material used for the material layer in the information recording medium of the present invention has a small thermal conductivity and high adhesion with the recording layer, so that in the information recording medium to which an electric energy is to be applied, if this material is used as a layer for insulating heat from the recording layer, a phase change can be caused in the recording layer with a smaller electric energy.

The material layer in the information recording medium of the present invention has excellent adhesion with other layers, a small thermal conductivity and high insulating properties, so that this material layer can be used not only for recording media utilizing a phase change, but also other information recording media in which heat may be generated during recording.

The information recording medium of the present invention and the method for producing the same can be applied as a high density information recording medium to, for example, DVD-RAM, DVD-RW, DVD+RW (Digital Versatile Disk+Rewritable), recording media for BD (Blu-ray Disk), rewritable information recording media such as BD-R (Blu-ray Disk Recordable), magneto-optical recording media, and memories configured by using electric energy or optical energy.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. An information recording medium comprising a substrate and a recording layer that allows at least one of recording and reproduction by irradiation of light or application of electric energy, further comprising a material layer containing at least one element selected from the group GM consisting of Sn, Ga and Zn, at least one element selected from the group GL consisting of Al, Si and B, and oxygen (O), and optionally nitrogen (N), wherein when the at least one element selected from the group GM is Ga or Zn, the elements of the group GL are present in the form of nitride.

2. The information recording medium according to claim 1, wherein the material layer comprises a material expressed by the following composition formula:

$M_H O_I L_J N_K$ (atom %)

where M is at least one element selected from the group GM, L is at least one element selected from the group GL, and H, I, J and K satisfy $10 \leq H \leq 50$, $10 \leq I \leq 70$, $0 < J \leq 40$, and $0 \leq K \leq 50$.

3. The information recording medium according to claim 2, wherein
the material layer comprises Sn as the M.

4. The information recording medium according to claim 2, wherein
the material layer comprises Ga as the M.

5. The information recording medium according to claim 2, wherein
the material layer comprises Sn as the M, and comprises at least one element selected from Si and Al as the L.

6. The information recording medium according to claim 2, wherein
the material layer comprises Ga as the M, and comprises at least one element selected from Si and Al as the L.

7. The information recording medium according to claim 2, wherein
the material layer comprises Sn and Ga as the M, and comprises at least one element selected from Si and Al as the L.

8. An information recording medium comprising a substrate and a recording layer that allows at least one of recording and reproduction by irradiation of light or application of electric energy,
further comprising a material layer containing at least one element selected from the group GM consisting of Sn, Ga and Zn, oxygen (O), at least one element selected from the group GA consisting of La and Ce, and fluorine (F).

9. The information recording medium according to claim 8, wherein
the material layer comprises a material expressed by the following composition formula:

$M_H O_I A_D F_E$ (atom %)

where M is at least one element selected from the group GM, A is at least one element selected from the group GA, and H, I, D and E satisfy $10 \leq H \leq 50$, $10 \leq I \leq 70$, $0 < D \leq 40$, and $0 < E \leq 50$.

10. The information recording medium according to claim 1, wherein
in the material layer, the element selected from the group GM is at least one of Sn and Ga.

11. The information recording medium according to claim 1, wherein
in the material layer, the element selected from the group GM is Ga.

12. The information recording medium according to claim 1, wherein
a phase change occurs reversibly in the recording layer.

13. The information recording medium according to claim 12, wherein
the recording layer comprises any one material selected from Ge—Sb—Te, Ge—Sn—Sb—Te, Ge—Bi—Te, Ge—Sn—Bi—Te, Ge—Sb—Bi—Te, Ge—Sn—Sb—Bi—Te, Ag—In—Sb—Te and Sb—Te.

14. The information recording medium according to claim 12, wherein
the recording layer has a thickness of 15 nm or less.

15. The information recording medium according to claim 1, wherein
the material layer is formed in contact with at least one surface of the recording layer.

16. The information recording medium according to claim 1, wherein
a first dielectric layer, the recording layer, a second dielectric layer and a reflective layer are formed on one surface of the substrate in this order, and at least one of the first dielectric layer and the second dielectric layer is the material layer.

17. The information recording medium according to claim 1, wherein
a first dielectric layer, an interface layer, the recording layer, a second dielectric layer, a light-absorption correction layer and a reflective layer are formed on one surface of the substrate in this order, and the second dielectric layer is the material layer.

18. A method for producing an information recording medium comprising a substrate, a recording layer and a material layer that allows at least one of recording and reproduction by irradiation of light or application of electric energy,
comprising forming the material layer by sputtering, using a sputtering target containing at least one element selected from the group GM consisting of Sn, Ga and Zn, at least one element selected from the group GL consisting of Al, Si and B, and oxygen (O), and optionally nitrogen (N),
wherein when the at least one element selected from the group GM is Ga or Zn, the elements of the group GL are present in the form of nitride.

19. The method for producing information recording medium according to claim 18, wherein
the sputtering target comprises a material expressed by the following composition formula:

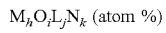
$M_h O_i L_j N_k$ (atom %)

where M is at least one element selected from the group GM, L is at least one element selected from the group GL, and h, i, j and k satisfy $10 \leq h \leq 50$, $10 \leq i \leq 70$, $0 < j \leq 40$, and $0 \leq k \leq 50$.

20. The method for producing information recording medium according to claim 19, wherein
the sputtering target comprises Sn as the M.

21. The method for producing information recording medium according to claim 19, wherein
the sputtering target comprises Ga as the M.

22. The method for producing information recording medium according to claim 19, wherein
the sputtering target comprises Sn as the M, and comprises at least one element selected from Si and Al as the L.

23. The method for producing information recording medium according to claim 19, wherein
the sputtering target comprises Ga as the M, and comprises at least one element selected from Si and Al as the L.

24. The method for producing information recording medium according to claim 19, wherein
the sputtering target comprises Sn and Ga as the M, and comprises at least one element selected from Si and Al as the L.

25. A method for producing an information recording medium comprising a substrate, a recording layer and a material layer that allows at least one of recording and reproduction by irradiation of light or application of electric energy,
comprising forming the material layer by sputtering, using a sputtering target containing at least one element selected from the group GM consisting of Sn, Ga and Zn, oxygen (O), at least one element selected from the group GA consisting of La and Ce, and fluorine (F).

26. The method for producing information recording medium according to claim 25, wherein
the sputtering target comprises a material expressed by the following composition formula:

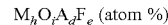
$M_h O_i A_d F_e$ (atom %)

where M is at least one element selected from the group GM, A is at least one element selected from the group GA, and h, i, d and e satisfy $10 \leq h \leq 50$, $10 \leq i \leq 70$, $0 < d \leq 40$, and $0 < e \leq 50$.

27. The method for producing information recording medium according to claim 18, wherein
in the sputtering target, the element selected from the group GM is at least one of Sn and Ga.

28. The method for producing information recording medium according to claim 18, wherein
the sputtering target comprises (a) an oxide of at least one element selected from the group GM consisting of Sn, Ga and Zn, and (b) at least one of an oxide and a nitride of at least one element selected from the group GL consisting of Al, Si and B.

29. The method for producing information recording medium according to claim 25, wherein
the sputtering target comprises (a) an oxide of at least one element selected from the group GM consisting of Sn, Ga and Zn, and (c) a fluoride of at least one element selected from the group GA consisting of La and Ce.

30. The method for producing information recording medium according to claim 28, wherein
in the sputtering target, the oxide of an element selected from the group GM is an oxide of at least one element selected from Sn and Ga.

31. The method for producing information recording medium according to claim 30, wherein
in the sputtering target, the oxide of an element selected from the group GM is an oxide of Ga.

32. The method for producing information recording medium according to claim 28, wherein
the sputtering target comprises an oxide group of an element selected from the group GM in 50 mol % or more.

33. The method for producing information recording medium according to claim 32, wherein
the sputtering target comprises an oxide of Sn and an oxide of Ga in a combined amount of 50 mol % or more.

34. The method for producing information recording medium according to claim 28, wherein
the sputtering target comprises at least one of an oxide and a nitride of at least one element selected from Si and Al as the at least one of an oxide and nitride of an element selected from the group GL.

35. The method for producing information recording medium according to claim 32, wherein
the sputtering target comprises a material expressed by the following composition formula:

$(D)_x(E)_{100-x}$ (mol %)

where D is at least one oxide selected from $SnO_2$, $Ga_2O_3$ and ZnO, E is at least one compound selected from AlN, $Si_3N_4$, $Al_2O_3$ and $SiO_2$, and x satisfies $50 \leq x \leq 95$.

36. The method for producing information recording medium according to claim 35, wherein
the sputtering target comprises a material expressed by the following composition formula:

$(SnO_2)_{a1}(Ga_2O_3)_{a2}(E1)_b$ (mol %)

where E1 is at least one nitride selected from AlN and $Si_3N_4$, a1 and a2 satisfy $50 \leq a1+a2 \leq 95$, either one of a1 and a2 may be 0, b satisfies $5 \leq b \leq 50$, and a1+a2+b=100.

37. The method for producing information recording medium according to claim 35, wherein
the sputtering target comprises a material expressed by the following composition formula:

$(D)_x(SiO_2)_y(E1)_{100-x-y}$ (mol %)

where D is at least one oxide selected from $SnO_2$, $Ga_2O_3$, and ZnO, E1 is at least one nitride selected from AlN and $Si_3N_4$, x and y satisfy $50 \leq x \leq 95$, $5 \leq y \leq 35$, and $55 \leq x+y \leq 100$.

38. The method for producing information recording medium according to claim 35, wherein
in the sputtering target, D is at least one of $SnO_2$ and $Ga_2O_3$.

39. The method for producing information recording medium according to claim 35, wherein
in the sputtering target, D is $Ga_2O_3$.

40. The method for producing information recording medium according to claim 29, wherein
the sputtering target comprises a material expressed by the following composition formula:

$(D)_x(A)_{100-x}$ (mol %)

where D is at least one oxide selected from $SnO_2$, $Ga_2O_3$, and ZnO, A is at least one fluoride selected from $LaF_3$ and $CeF_3$, and x satisfies $50 \leq x \leq 95$.

41. The method for producing information recording medium according to claim 40, wherein
in the sputtering target, D is at least one of $SnO_2$ and $Ga_2O_3$.

42. The method for producing information recording medium according to claim 41, wherein
in the sputtering target, D is $Ga_2O_3$.

43. The information recording medium according to claim 8, wherein
in the material layer, the element selected from the group GM is at least one of Sn and Ga.

44. The information recording medium according to claim 8, wherein
in the material layer, the element selected from the group GM is Ga.

45. The information recording medium according to claim 8, wherein
a phase change occurs reversibly in the recording layer.

46. The information recording medium according to claim 8, wherein
the material layer is formed in contact with at least one surface of the recording layer.

47. The information recording medium according to claim 8, wherein
a first dielectric layer, the recording layer, a second dielectric layer and a reflective layer are formed on one surface of the substrate in this order, and at least one of the first dielectric layer and the second dielectric layer is the material layer.

48. The information recording medium according to claim 8, wherein
a first dielectric layer, an interface layer, the recording layer, a second dielectric layer, a light-absorption correction layer and a reflective layer are formed on one surface of the substrate in this order, and the second dielectric layer is the material layer.

49. The method for producing information recording medium according to claim 25, wherein
in the sputtering target, the element selected from the group GM is at least one of Sn and Ga.

50. The method for producing information recording medium according to claim 29, wherein
in the sputtering target, the oxide of an element selected from the group GM is an oxide of at least one element selected from Sn and Ga.

51. The method for producing information recording medium according to claim 29, wherein
the sputtering target comprises an oxide group of an element selected from the group GM in 50 mol % or more.

* * * * *